United States Patent
Im et al.

(10) Patent No.: US 9,391,250 B2
(45) Date of Patent: Jul. 12, 2016

(54) ELECTRONIC DEVICE PACKAGE AND PACKAGE SUBSTRATE FOR THE SAME

(71) Applicant: SAMSUNG ELECTRONICS CO., LTD., Suwon-si, Gyeonggi-do (KR)

(72) Inventors: Sung Jun Im, Yongin-si (KR); Min Young Son, Seoul (KR); Yong Min Kwon, Seoul (KR); Hak Hwan Kim, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/251,170

(22) Filed: Apr. 11, 2014

(65) Prior Publication Data

US 2014/0306261 A1 Oct. 16, 2014

(30) Foreign Application Priority Data

Apr. 15, 2013 (KR) .................... 10-2013-0041236

(51) Int. Cl.
| | |
|---|---|
| *H01L 21/48* | (2006.01) |
| *H01L 23/49* | (2006.01) |
| *H01L 33/62* | (2010.01) |
| *H01L 33/54* | (2010.01) |
| H01L 23/538 | (2006.01) |
| H01L 23/498 | (2006.01) |
| H01L 33/48 | (2010.01) |

(52) U.S. Cl.
CPC ............... *H01L 33/62* (2013.01); *H01L 33/54* (2013.01); *H01L 21/486* (2013.01); *H01L 23/49827* (2013.01); *H01L 23/5384* (2013.01); *H01L 33/486* (2013.01); *H01L 2224/0557* (2013.01); *H01L 2224/13* (2013.01); *H01L 2225/06541* (2013.01); *H01L 2225/06548* (2013.01); *H01L 2933/0033* (2013.01)

(58) Field of Classification Search
CPC .............. H01L 21/486; H01L 23/5384; H01L 23/49827; H01L 2224/0557; H01L 2225/06541; H01L 2225/06548
See application file for complete search history.

(56) References Cited

U.S. PATENT DOCUMENTS

| | | | | | |
|---|---|---|---|---|---|
| 5,014,114 | A | * | 5/1991 | Heckaman | ............ H01L 23/057 257/685 |
| 5,394,011 | A | * | 2/1995 | Yamamoto et al. | ........... 257/693 |
| 5,628,919 | A | * | 5/1997 | Tomura | ............... H01L 21/4853 156/89.17 |
| 6,388,207 | B1 | * | 5/2002 | Figueroa | ........... H01L 23/49805 174/261 |
| 6,407,458 | B1 | * | 6/2002 | Huemoeller | ...... H01L 23/49816 257/774 |
| 6,472,732 | B1 | * | 10/2002 | Terui | ............................ 257/678 |

(Continued)

FOREIGN PATENT DOCUMENTS

| | | |
|---|---|---|
| JP | 2002-335020 A | 11/2002 |
| JP | 2011-129862 A | 6/2011 |

(Continued)

*Primary Examiner* — Ida M Soward

(57) ABSTRACT

There is provided an electronic device package including an electronic device including a first electrode and a second electrode disposed on a surface thereof, a package substrate having a first surface having the electronic device mounted thereon and a second surface opposed to the first surface. The package substrate includes a first electrode pattern and a second electrode pattern electrically connected to the first electrode and the second electrode on the first surface, respectively. The package substrate further includes at least one via hole disposed outside of a region for mounting the electronic device and an irregular portion disposed on the first surface to be adjacent to the via hole.

18 Claims, 15 Drawing Sheets

(56) References Cited

U.S. PATENT DOCUMENTS

| | | | |
|---|---|---|---|
| 6,531,328 B1* | 3/2003 | Chen | 438/26 |
| 6,663,943 B2* | 12/2003 | Kadota | 428/156 |
| 7,459,783 B2* | 12/2008 | Liu et al. | 257/707 |
| 7,772,081 B2* | 8/2010 | Lin et al. | 438/393 |
| 7,960,773 B2* | 6/2011 | Chang et al. | 257/307 |
| 8,193,604 B2* | 6/2012 | Lin et al. | 257/531 |
| 8,218,334 B2* | 7/2012 | Chow et al. | 361/790 |
| 8,421,193 B2* | 4/2013 | Huang | 257/621 |
| 8,492,902 B2* | 7/2013 | Lee et al. | 257/774 |
| 8,716,734 B2* | 5/2014 | Tsai et al. | 257/98 |
| 8,853,552 B2* | 10/2014 | Takenaka | H01L 23/49822 174/255 |
| 2006/0012967 A1* | 1/2006 | Asai et al. | 361/764 |
| 2006/0220261 A1* | 10/2006 | Egawa | H01L 24/94 257/778 |
| 2007/0018190 A1 | 1/2007 | Kim et al. | |
| 2007/0200146 A1* | 8/2007 | Onishi | H03H 9/0523 257/202 |
| 2008/0029774 A1 | 2/2008 | Shishov et al. | |
| 2008/0099771 A1 | 5/2008 | Jong et al. | |
| 2008/0236876 A1* | 10/2008 | Kodama et al. | 174/260 |
| 2008/0251287 A1* | 10/2008 | Shiraishi et al. | 174/262 |
| 2008/0283951 A1* | 11/2008 | Nabe | H01L 21/76898 257/433 |
| 2008/0284041 A1* | 11/2008 | Jang et al. | 257/774 |
| 2009/0008729 A1* | 1/2009 | Yang et al. | 257/432 |
| 2009/0321921 A1* | 12/2009 | Hwang | H01L 23/13 257/701 |
| 2010/0044853 A1* | 2/2010 | Dekker | B81C 1/00087 257/692 |
| 2010/0140736 A1* | 6/2010 | Lin et al. | 257/528 |
| 2010/0148293 A1* | 6/2010 | Jain et al. | 257/434 |
| 2010/0237378 A1* | 9/2010 | Lin et al. | 257/99 |
| 2011/0031607 A1* | 2/2011 | Lin | H01L 23/49827 257/692 |
| 2011/0114989 A1 | 5/2011 | Suehiro et al. | |
| 2011/0171781 A1* | 7/2011 | Lee et al. | 438/113 |
| 2012/0062439 A1* | 3/2012 | Liao et al. | 343/841 |
| 2012/0202321 A1* | 8/2012 | Dunne et al. | 438/119 |
| 2012/0241906 A1* | 9/2012 | Nakanishi | H01L 23/49827 257/532 |
| 2012/0273819 A1* | 11/2012 | Lin | H01L 33/486 257/98 |
| 2013/0154108 A1* | 6/2013 | Lin et al. | 257/774 |
| 2013/0200528 A1* | 8/2013 | Lin et al. | 257/774 |

FOREIGN PATENT DOCUMENTS

| | | | |
|---|---|---|---|
| KR | 10-0631993 B1 | 9/2006 | |
| KR | 20090057662 A * | 6/2009 | H01L 24/97 |
| KR | 20100066769 A * | 6/2010 | H01L 24/97 |
| KR | 10-2010-0122678 A | 11/2010 | |

* cited by examiner

ELECTRONIC DEVICE PACKAGE AND PACKAGE SUBSTRATE FOR THE SAME

CROSS-REFERENCE TO RELATED APPLICATION

This application claims the benefit of priority to Korean Patent Application No. 10-2013-0041236 filed on Apr. 15, 2013, with the Korean Intellectual Property Office, the disclosure of which is incorporated herein by reference.

BACKGROUND

The inventive concept relates to an electronic device package and a package substrate for the same.

Electronic devices are driven by external electrical energy applied thereto and may include photoelectronic devices such as semiconductor light emitting devices and solar cells.

In general, an electronic device may be provided in a package form and mounted on a desired apparatus. A package substrate used for the package may include electrode patterns corresponding to electrodes of the electronic device. In addition, the package substrate may include a through-silicon via (TSV). Through-silicon via technology is technology for forming a hole penetrating through a package substrate and connecting top and bottom portions of the package substrate to transmit signals and power between an electronic device and an external apparatus. When the TSV is positioned directly below an LED chip, since the LED chip disposed on the TSV is relatively thin and has a thickness corresponding to a tenth of a diameter of the TSV, mechanical damage to the LED chip occur during a subsequent process. Further, a process for filling the interior of the TSV is additionally required. In the case in which the TSV is positioned outside of the LED chip and the interior of the TSV is filled with a lens material, when the lens material expands due to heat, etc., an electrode pattern disposed thereon can have stress applied thereto to cause breakage of the LED chip. So, there is a further need for improved techniques to address such problems in electronic device packaging technology over conventional technologies.

SUMMARY

An exemplary embodiment of the inventive concept described herein provides an electronic device package having a subminiature size and a package substrate for the same. Another aspect of the inventive concept also provides an electronic device package having improved reliability and a package substrate for the same.

According to an exemplary embodiment of the inventive concept, an electronic device package includes an electronic device including a first electrode and a second electrode disposed on a surface thereof and a package substrate having a first surface including the electronic device mounted thereon and a second surface opposed to the first surface. The package substrate includes: a first electrode pattern and a second electrode pattern electrically connected to the first electrode and the second electrode on the first surface, respectively; at least one via hole disposed outside of a region for mounting the electronic device, in the package substrate; and an irregular portion disposed on the first surface to be adjacent to the via hole.

The irregular portion may be disposed between at least one of the first electrode and the second electrode and the via hole.

The irregular portion may include a recessed portion and at least one portion of the recessed portion may be filled with the first electrode pattern or the second electrode pattern.

The irregular portion may include a protrusion portion and the protrusion portion may be covered by the first electrode pattern or the second electrode pattern.

The irregular portion may be disposed in a second direction perpendicular to a first direction in which one of the first electrode and the second electrode, adjacent to the irregular portion, and the via hole are connected.

A length of the irregular portion in the second direction may be greater than a length thereof in the first direction.

The irregular portion may include a plurality of irregular portions arranged to be adjacent to each other in parallel.

The first pattern and second electrode may extend to the second surface.

At least one of the first electrode pattern and the second electrode pattern may extend to the second surface through an inside wall of the via hole.

Each of the first electrode pattern and the second electrode pattern may include: an device connection portion connected to one of the first electrode and the second electrode; an external connection portion positioned on the second surface; a connection portion positioned within the via hole and connecting the device connection portion and the external connection portion; and a notch portion in the irregular portion.

The electronic device may have a circular cross-sectional shape and the device connection portion may have at least one curved surface corresponding to a portion of the circular cross-sectional shape.

The package substrate may include a quadrangular shape, and the via hole may be positioned outside of the electronic device, in each corner of the package substrate.

The electronic device may include a light emitting structure including a first conductivity type semiconductor layer, an active layer and a second conductivity type semiconductor layer, and the first electrode and the second electrodes may be connected to the first conductivity type semiconductor layer and the second conductivity type semiconductor layer, respectively.

The electronic device package may further include a sealing part, wherein a material forming the sealing part may extend into the via hole, such that the via hole may be filled with the sealing part.

According to another exemplary embodiment of the inventive concept, there is provided a package substrate having a first surface including an electronic device mounted thereon and a second surface opposed to the first surface. The package substrate includes an electrode pattern disposed on the first surface, a via hole disposed outside of a region for mounting the electronic device, in the package substrate, and an irregular portion disposed on the first surface to be adjacent to the via hole.

Another exemplary embodiment of the inventive concept provides a light emitting device package including a light emitting device and a package substrate. The light emitting device includes at least one electrode. The package substrate includes a first surface and a second surface opposed to the first surface. The light emitting device is disposed on the first surface of the package substrate. The package substrate comprises at least one electrode pattern connected to the at least one electrode of the light emitting device on the first surface of the package substrate, a via hole disposed outside a region for mounting the light emitting device in the package substrate, and an irregular portion of the first surface of the package substrate disposed between the at least one electrode and the via hole. The irregular portion of the first surface includes at least one of a recessed portion or a protrusion portion.

The irregular portion of the first surface of the package substrate may include a recessed portion, and at least one portion of the recessed portion may be filled with the at least one electrode pattern.

The irregular portion of the first surface of the package substrate may include a protrusion portion, and at least one portion of the protrusion portion may be covered by the at least one electrode pattern.

Another exemplary embodiment of the inventive concept provides a lighting device. The lighting device includes a light emitting module comprising at least one electronic device package, a driving unit configured to convert power from an external connector into a current source for driving the light emitting module, a cover unit disposed above the light emitting module, and an external housing enclosing the light emitting module and driving unit.

Another exemplary embodiment of the inventive concept provides a vehicle lighting element. The vehicle lighting element includes a housing, a lens cover comprising a lens and a hallow guide, a light source disposed inside the housing, and a reflective unit disposed above the light source. The lens cover and reflective unit are coupled to the housing and the light source is disposed on a heat radiating unit.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF EXEMPLARY EMBODIMENTS

Figure 1:
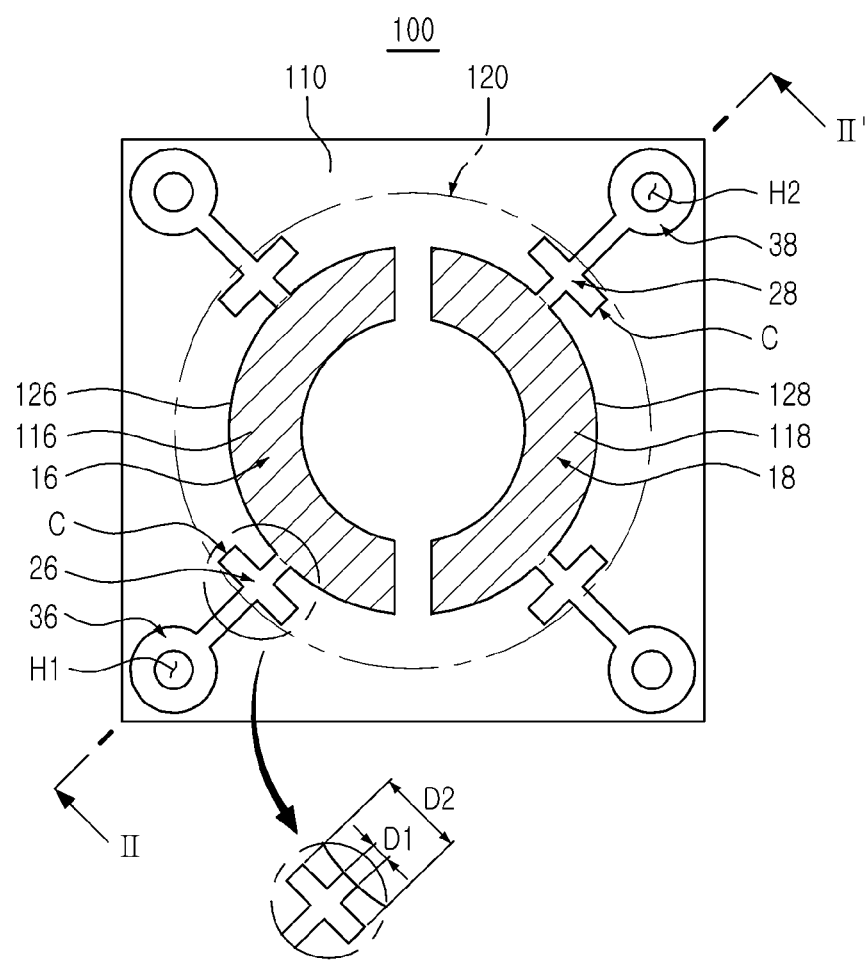
FIG. 1 is a plan view schematically illustrating a semiconductor light emitting device package according to an exemplary embodiment of the inventive concept.

Hereinafter, exemplary embodiments of the inventive concept will be described in detail with reference to the accompanying drawings.

The inventive concept may, however, be embodied in many different forms and should not be construed as being limited to the embodiments set forth herein. Rather, these exemplary embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
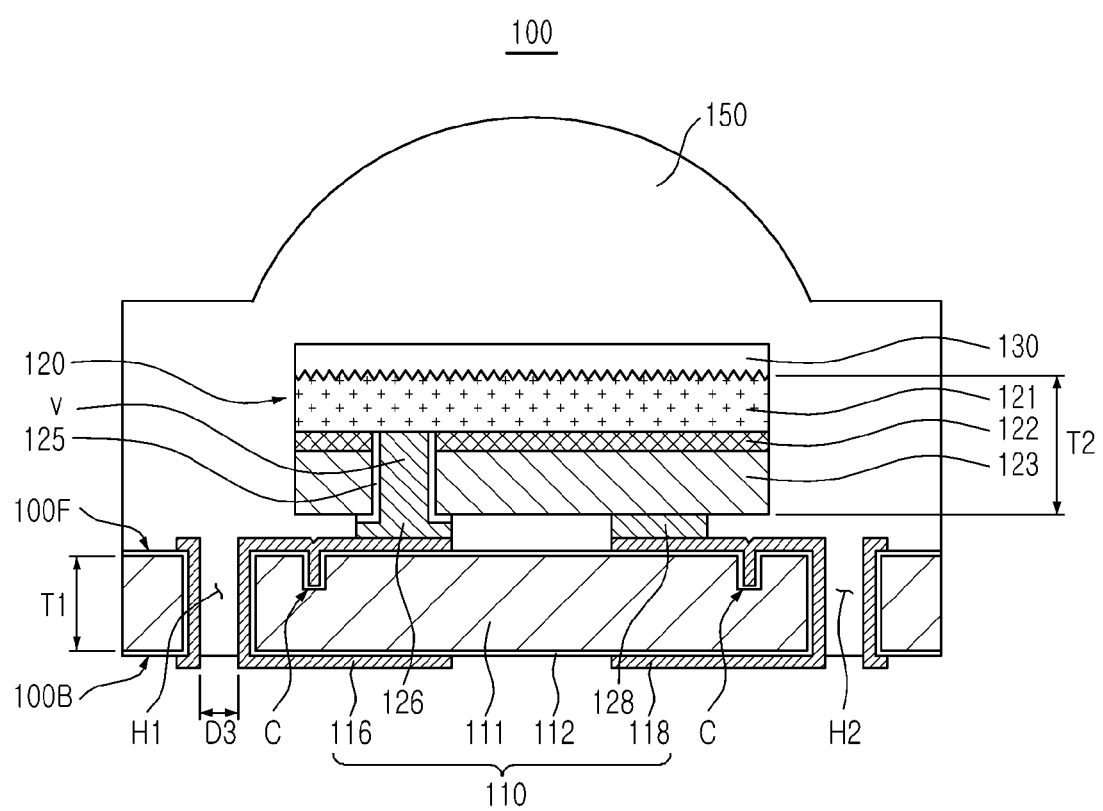
FIG. 2 is a cross-sectional view schematically illustrating a cross-section of the semiconductor light emitting device package, taken along line II-II' of FIG. 1.

FIG. 1 is a plan view schematically illustrating a semiconductor light emitting device package according to an exemplary embodiment of the inventive concept. FIG. 2 is a cross-sectional view schematically illustrating a cross-section of the semiconductor light emitting device package, taken along line II-II' of FIG. 1.

Examples of an electronic device package according to an exemplary embodiment of the inventive concept may include a photoelectronic device package such as a semiconductor light emitting device package or a solar cell package, a memory device package, a logic device package, and the like. Specifically, the electronic device package is exemplified as a semiconductor light emitting device package in FIGS. 1 and 2, and hereinafter, embodiments of the inventive concept will be described using the semiconductor light emitting device package.

For the sake of convenience, FIG. 1 illustrates components of the semiconductor light emitting device package, except for a wavelength conversion part 130 and a lens part 150 illustrated in FIG. 2.

Referring to FIGS. 1 and 2, a semiconductor light emitting device package 100 according to an exemplary embodiment of the inventive concept may include a package substrate 110 and a semiconductor light emitting device 120 mounted on the package substrate 110, and may further include the wavelength conversion part 130 and the lens 150. The semiconductor light emitting device package 100 according to the exemplary embodiment may be a chip scale package (CSP) or a wafer level package (WLP).

The package substrate 110 may include a body part 111, an insulating layer 112 enclosing the body part 111, and first and second electrode patterns 116 and 118 on the insulating layer 112. The semiconductor light emitting device 120 may include a light emitting structure including a first conductivity type semiconductor layer 121, an active layer 122, and a second conductivity type semiconductor layer 123, and first and second electrodes 126 and 128.

In the specification, the terms 'above,' 'upper portion,' 'upper surface,' 'below,' 'lower portion,' 'lower surface,' 'side surface,' and the like, as used herein, are used based on the drawings, and may actually be different depending on a direction in which a device is actually disposed.

The package substrate 110 may have a first surface 110F on which the semiconductor light emitting device 120 is mounted and a second surface 110B opposed to the first surface 110F. The package substrate 110 may be provided with first and second via holes H1 and H2 penetrating through the package substrate 110, and irregular portions C may be formed on the first surface 110F. The term "irregular portion(s)" is used herein to mean a portion of the first surface of the package substrate, which includes either irregular or regular geometric shapes.

The body part 111 may include a semiconductor material such as silicon (Si), a ceramic material such as AlN or $Al_2O_3$, a metal material, or a polymer material. The body part 111 may include a conductive or insulting material and, for example, have a plurality of metal layers stacked therein. The body part 111 may have a thickness T1 of approximately 600 μm to approximately 800 μm.

The irregular portions C may be formed on the first surface 110F of the body part 111. The irregular portions C may be positioned between the first electrode 126 and the first via hole H1 and between the second electrode 128 and the second via hole H2 of the semiconductor light emitting device 120. In addition, as illustrated in FIG. 1, the irregular portions C may be disposed in a direction perpendicular to directions in which the first and second electrode patterns 116 and 118 extend to the first and second via holes H1 and H2, respectively. The total four irregular portions C are illustrated in the exemplary embodiment of FIG. 1, but the number of the irregular portions C is not limited thereto and may vary. In the exemplary embodiment, the irregular portions C include recessed portions or notched regions. The irregular portions C may be filled with one of the first and second electrode patterns 116 and 118 and only portions of the irregular portions C may be filled therewith according to exemplary embodiments of the inventive concept.

The insulating layer 112 may be formed to cover at least one surface of the body part 111. The insulating layer 112 may be formed of an electrically insulating material, for example, a resin. The insulating layer 112 may be omitted in a case in which the body part 111 is formed of an insulating material.

The first and second electrode patterns 116 and 118 may be connected to the first and second electrodes 126 and 128 of the semiconductor light emitting device 120, respectively, and formed on the insulating layer 112 to be electrically isolated from the body part 111. The first and second electrode patterns 116 and 118 may extend to the second surface 110B from the first surface 110F through inside walls of the first and second via holes H1 and H2, respectively, as shown in FIG. 2.

As illustrated in FIG. 1, the first and second electrode patterns 116 and 118 may include device connection portions 16 and 18 connected to the first and second electrodes 126 and 128 of the semiconductor light emitting device 120, notch portions 26 and 28 formed in the irregular portions C of the package substrate 110, and connection portions 36 and 38 surrounding the first and second via holes H1 and H2. The device connection portions 16 and 18 may be connected to the first and second electrodes 126 and 128 of the semiconductor light emitting device 120 and may have outer surfaces having shapes similar to that of the semiconductor light emitting device 120. For example, the device connection portions 16 and 18 may have curved surfaces forming portions of a circular shape, as illustrated in FIG. 1. Although not illustrated in the drawings, an external connection portion having a similar shape to those of the device connection portions 16 and 18 and connected to an external apparatus may also be formed on the second surface 110B. As shown in FIG. 1, the notch portions 26 and 28 may have widths D2 greater than widths D1 in which the first and second electrode patterns 116 and 118 extend to the first and second via holes H1 and H2, respectively. The notch portions 26 and 28 may be positioned between the device connection portions 16 and 18 and the connection portions 36 and 38. Distances between the notch portions 26 and 28 and the first and second via holes H1 and H2 are not limited to being illustrated in the drawings and may be variously modified according to exemplary embodiments of the inventive concept.

The first and second via holes H1 and H2 may be through-silicon vias (TSV). As illustrated in FIG. 1, the first and second via holes H1 and H2 may be disposed outside of a region in which the semiconductor light emitting device 120 is mounted (hereinafter, referred to as 'a region for mounting the semiconductor light emitting device). The first and second via holes H1 and H2 may respectively disposed in four corners of the package substrate 110. Through such a disposition of the first and second via holes H1 and H2, the semiconductor light emitting device 120 having a relatively small thickness is not disposed on upper portions of the first and second via holes H1 and H2, such that mechanical damage to the semiconductor light emitting device 120, which may be generated during the manufacturing of the semiconductor light emitting device package 100, may be prevented. Further, the upper portions of the first and second via holes H1 and H2 are opened, such that the interiors of the first and second via holes H1 and H2 can be simultaneously filled during the formation of the lens 150, to thereby allow for a simplified process.

Figure 3:
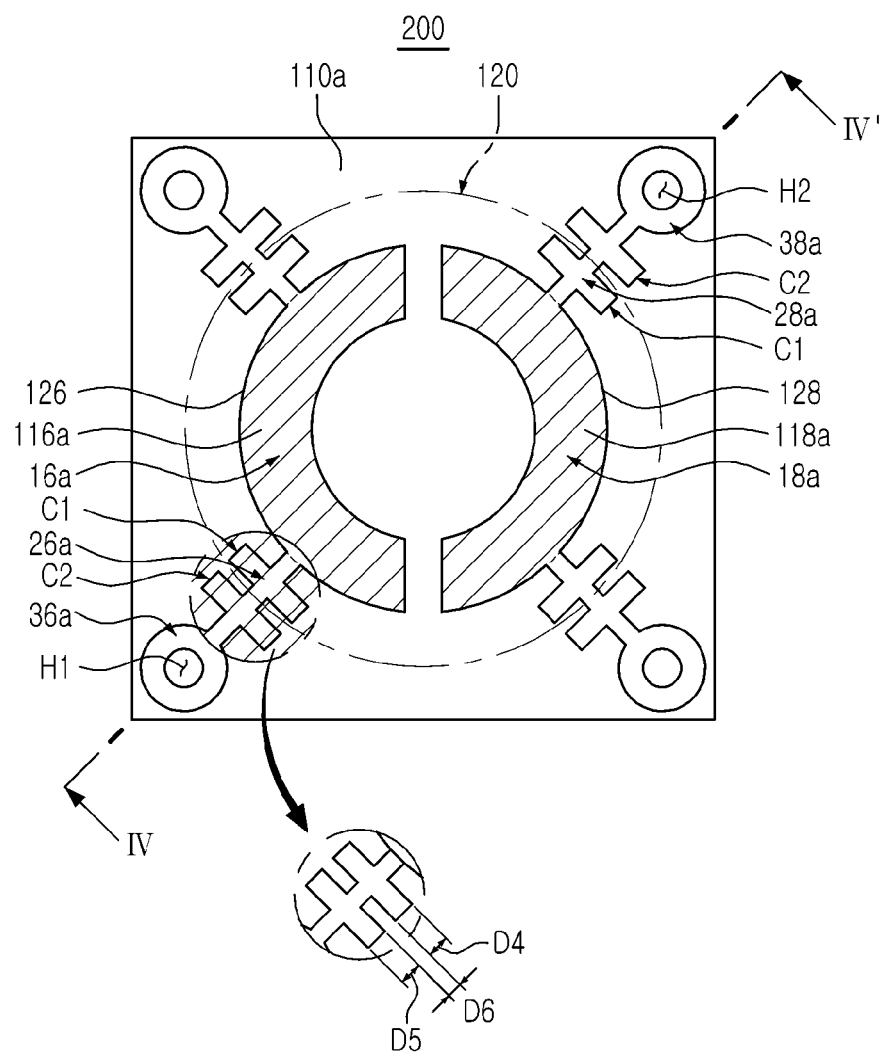
FIG. 3 is a plan view schematically illustrating a semiconductor light emitting device package according to an exemplary embodiment of the inventive concept.

As illustrated in FIG. 3, each of the first and second via holes H1 and H2 includes an internal diameter D3 of approximately 250 μm to approximately 350 μm. The insulating layer 112 and the first and second electrode patterns 116 and 118 may be formed on the inside surfaces of the first and second via holes H1 and H2.

As discussed earlier, the semiconductor light emitting device 120 is mounted on the package substrate 110 and includes the light emitting structure comprising the first conductivity type semiconductor layer 121, the active layer 122, and the second conductivity type semiconductor layer 123, and the first and second electrodes 126 and 128. As illustrated in FIG. 1, the light emitting structure may have a circular cross-sectional shape. The light emitting structure may have a thickness T2 of approximately 3 μm to approximately 10 μm. According to the embodiment, since the light emitting structure having the thickness T2, relatively small, may not be disposed on the first and second via holes H1 and H2 having the diameters D3, relatively large, damage to the semiconductor light emitting device 120 that may be generated during or after a manufacturing process may be prevented.

The first and second conductivity type semiconductor layers 121 and 123 may be an n-type semiconductor layer and a p-type semiconductor layer, respectively. However, the present inventive concept is not limited thereto and, the first and second conductivity type semiconductor layers 121 and 123 may be a p-type semiconductor layer and an n-type semiconductor layer, respectively. The first and second conductivity type semiconductor layers 121 and 123 may be formed of a nitride semiconductor, for example, a material having a composition of $Al_xIn_yGa_{1-x-y}N$ ($0 \le x \le 1$, $0 \le y \le 1$, $0 \le x+y \le 1$), and each semiconductor layer may be formed of a single layer but may also include a plurality of layers having different characteristics such as doping concentrations, compositions or the like. The first and second conductivity type semiconductor layers 121 and 123 may be formed using an AlInGaP-based or an AlInGaAs-based semiconductor, in addition to the nitride semiconductor.

The active layer 122 disposed between the first and second conductivity type semiconductor layers 121 and 123 may emit light having a predetermined degree of energy due to the recombination of electrons and holes and may have a multiple quantum well (MQW) structure in which quantum barrier and quantum well layers are alternately stacked. For example, in the case that the active layer 122 is formed of a nitride semiconductor, a GaN/InGaN structure may be used, but a single quantum well (SQW) structure may also be used.

In addition, although not illustrated, the semiconductor light emitting device 120 may further include a growth substrate disposed on the first conductivity type semiconductor layer 121. The growth substrate may have an unevenness structure formed on a surface thereof on which the first conductivity type semiconductor layer 121 is not formed. The growth substrate may be removed through a process such as a laser lift off process or the like. Although not illustrated in the drawings, a passivation layer may be formed to cover at least portions of upper and side surfaces of the semiconductor light emitting device 120. The passivation layer may be formed of a silicon nitride or a silicon oxide.

The first conductivity type semiconductor layer 121 may have unevenness formed on a surface thereof to thereby increase light extraction efficiency. For example, the unevenness may be obtained by wet etching the first conductivity type semiconductor layer 121 or dry etching the first conductivity type semiconductor layer 121 using plasma after the growth substrate has been removed from the light emitting structure.

The first and second electrodes 126 and 128 may be disposed on a lower surface of the semiconductor light emitting device 120. As illustrated in FIG. 1, the first and second electrodes 126 and 128 may have the same shapes as the device connection portions 16 and 18 of the first and second electrode patterns 116 and 118 and may be connected to the device connection portions 16 and 18, respectively.

The first and second electrodes 126 and 128 may be formed of a conductive material commonly known in the art, for example, at least one of Ag, Al, Ni, Cr, Cu, Au, Pd, Pt, Sn, W, Rh, Ir, Ru, Mg, Zn, Ti and alloys thereof. In the exemplary embodiment, the first electrode 126 includes a via v penetrating through the second conductivity type semiconductor layer 123 and the active layer 122 and electrically connected to the first conductivity type semiconductor layer 121. An electrode insulating layer 125 is disposed on a circumference of the via v in order to electrically insulate the first electrode 126 from the second conductivity type semiconductor layer 123 and the active layer 122. Further, the via v may be provided in plural and the plurality of vias V may be arranged in a plurality of rows and columns, for example.

The wavelength conversion member 130 may include phosphors excited by light emitted from the semiconductor light emitting device 120 to emit light having different wavelengths. Light emitted from the phosphors and light emitted from the semiconductor light emitting device 120 may be combined to thereby obtain a desired output light such as white light or the like. According to an exemplary embodiment, the wavelength conversion member 130 may be spaced apart from the semiconductor light emitting device 120 by a predetermined distance within the lens 150.

The lens 150 may be a sealing part covering and sealing the semiconductor light emitting device 120, and internal spaces of the first and second via holes H1 and H2 of the package substrate 110 may be filled with the lens 150. The lens 150 may be formed of a material having high light transmittance and heat-resistance properties, such as silicone, epoxy, glass, plastic or the like. The lens 150 may have a convex or concave lens shape, such that an orientation angle of light emitted through an upper surface of the lens part 150 can be controlled. The lens 150 may be formed of a highly transparent resin allowing light emitted from the semiconductor light emitting device 120 to be transmitted therethrough with minimum loss.

In the exemplary embodiment, the lens 150 has a dome shape in which an upper surface is bulged as illustrated in FIG. 2, but the inventive concept is not limited thereto. For example, in order to improve light diffusion in a lighting device or a backlight unit, the lens 150 may have colloidal particles disposed on a surface thereof and the upper surface thereof may also be planar. Alternatively, the lens 150 may have an aspherical or asymmetrical shape and the upper surface thereof may be uneven. Further, in order to increase linearity of light in a camera flash and the like, the lens 150 may include a light collecting member having a Fresnel shape and the upper surface thereof may be uneven.

The interiors of the first and second via holes H1 and H2 are filled with the material of the lens 150, whereby a manufacturing process of the semiconductor light emitting device package 100 may be simplified. When the material of the lens 150 filling the interiors of the first and second via holes H1 and H2 expands due to internal or external heat, stress applied to the first and second electrode patterns 116 and 118 may be alleviated by the notch portions 26 and 28 formed in the irregular portions C. Therefore, the first and second electrode patterns 116 and 118 may not be deformed coupling with the lens 150 filling the first and second via holes H1 and H2 to prevent damage to the semiconductor light emitting device 120.

Figure 4:
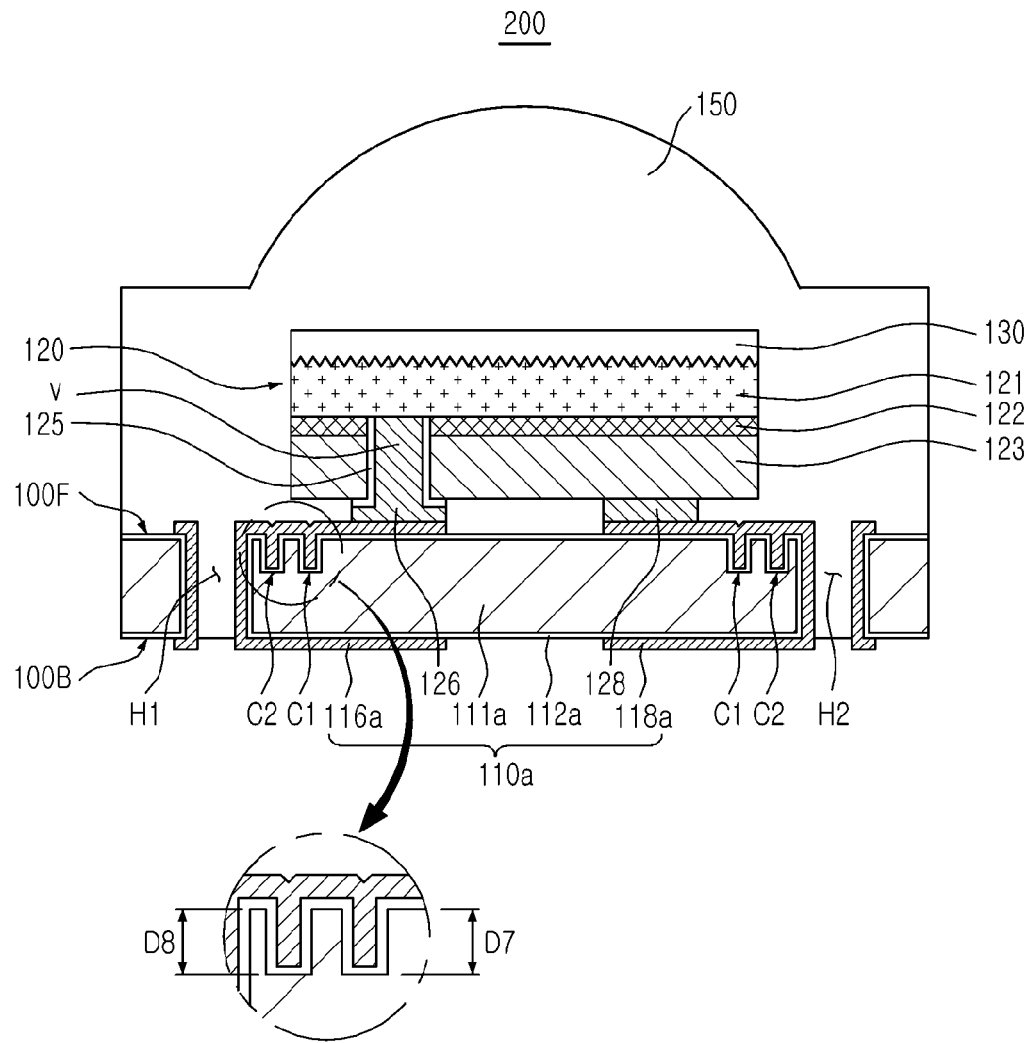
FIG. 4 is a cross-sectional view schematically illustrating a cross-section of the semiconductor light emitting device package, taken along line IV-IV' of FIG. 3.

FIG. 3 is a plan view schematically illustrating a semiconductor light emitting device package according to another exemplary embodiment of the inventive concept. FIG. 4 is a cross-sectional view schematically illustrating a cross-section of the semiconductor light emitting device package, taken along line IV-IV' of FIG. 3.

Referring to FIGS. 3 and 4, a semiconductor light emitting device package 200 according to another exemplary embodiment of the inventive concept includes a package substrate 110a and the semiconductor light emitting device 120 mounted on the package substrate 110a, and may further include the wavelength conversion member 130 and the lens 150.

The package substrate 110a includes a body member 111a, an insulating layer 112a enclosing the body member 111a, and first and second electrode patterns 116a and 118a on the insulating layer 112a. The package substrate 110a is provided with the first and second via holes H1 and H2 penetrating through the package substrate 110a, and irregular portions C1 and C2 are formed on an upper surface of the package substrate 110a.

Unlike the semiconductor light emitting device package 100 of FIGS. 1 and 2, the irregular portions include first and second irregular portions C1 and C2 adjacent to each other. The first and second irregular portions C1 and C2 may be positioned between the first electrode 126 and the first via hole H1 and between the second electrode 128 and the second via hole H2 of the semiconductor light emitting device 120. The first and second irregular portions C1 and C2 may have predetermined lengths D4 and D5 in directions in which the first and second electrode patterns 116a and 118a extend to the first and second via holes H1 and H2, respectively. The length D4 of the first irregular portion C1 and the length D5 of the second irregular portion C2 may be identical or different according to various embodiments. A distance D6 between the first irregular portion C1 and the second irregular portion C2 may be different according to the various embodiments. In addition, as shown in FIG. 4, the first and second irregular portions C1 and C2 may be formed to have predetermined depths D7 and D8 from the upper surface of the package substrate 110a, and the depth D7 of the first irregular portion C1 and the depth D8 of the second irregular portion C2 may be identical or different according to the various embodiments. It is noted that the lengths D4 and D5, the distance D6, and the depths D7 and D8 may be appropriately selected according to thicknesses, widths, and shapes of the first and second electrode patterns 116a and 118a.

In a similar manner to those of FIG. 1, the first and second electrode patterns 116a and 118a may include device connection portions 16a and 18a connected to the first and second electrodes 126 and 128 of the semiconductor light emitting device 120, notch portions 26a and 28a formed in the irregular portions C1 and C2 of the package substrate 110a, and connection portions 36a and 38a surrounding the first and second via holes H1 and H2.

In the semiconductor light emitting device package 200 according to the embodiment, even in a case in which the material of the lens 150 filling the interiors of the first and second via holes H1 and H2 is expanded due to internal or external heat, stress applied to the first and second electrode patterns 116a and 118a may be more efficiently alleviated by the first and second irregular portions C1 and C2 disposed to be parallel to each other.

Figure 5:
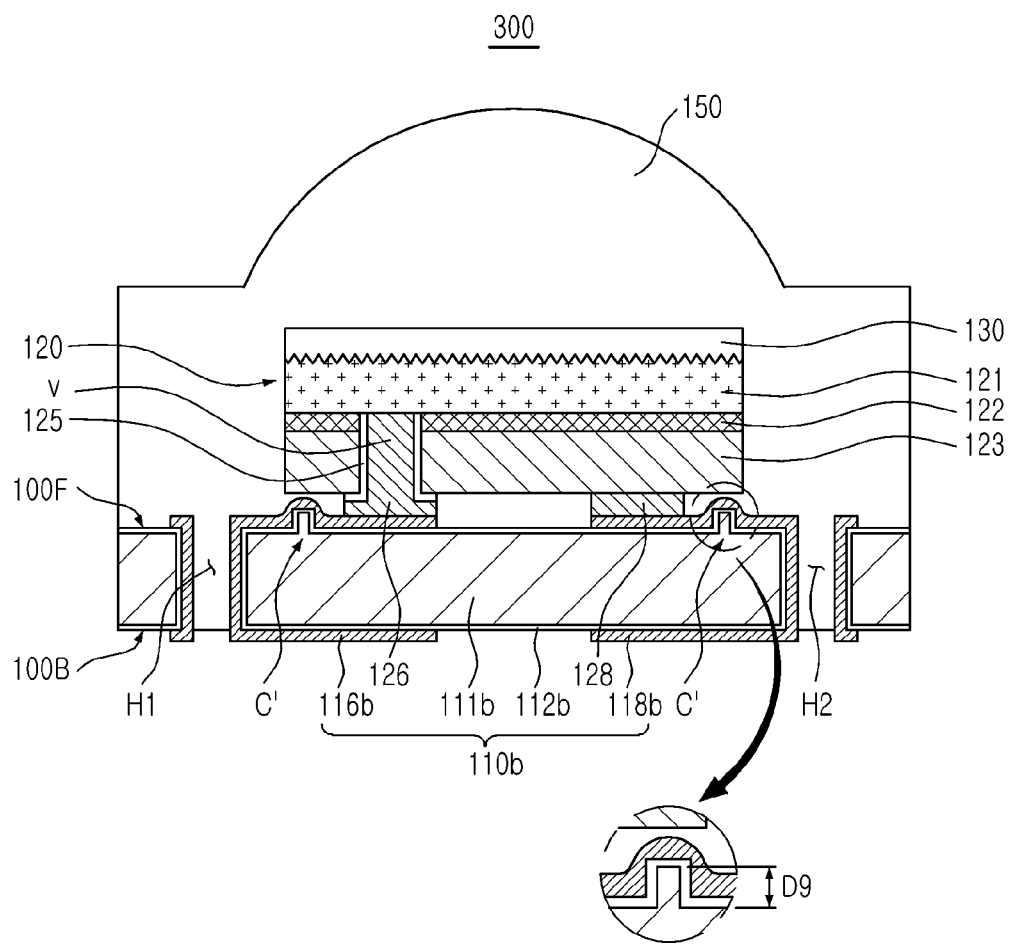
FIG. 5 is a cross-sectional view schematically illustrating a semiconductor light emitting device package according to an exemplary embodiment of the inventive concept.

FIG. 5 is a cross-sectional view schematically illustrating a semiconductor light emitting device package according to an exemplary embodiment of the inventive concept.

Referring to FIG. 5, a semiconductor light emitting device package 300 according to an exemplary embodiment of the inventive concept includes a package substrate 110b and the semiconductor light emitting device 120 mounted on the package substrate 110b, the wavelength conversion member, 130 and the lens 150.

The package substrate 110b may include a body member 111b, an insulating layer 112b enclosing the body member 111b, and first and second electrode patterns 116b and 118b on the insulating layer 112b. The package substrate 110b is provided with the first and second via holes H1 and H2 penetrating through the package substrate 110b, and irregular portions C' are formed on an upper surface of the package substrate 110b.

Unlike the semiconductor light emitting device package 100 of FIGS. 1 and 2, the irregular portions C' protrude toward the light emitting structure. The irregular portions C' may be positioned between the first electrode 126 and the first via hole H1 and between the second electrode 128 and the second via hole H2 of the semiconductor light emitting device 120. Further, the irregular portions C' may be formed to have a predetermined height D9 from the upper surface of the package substrate 110b, and the height D9 may be appropriately selected according to, for example, thicknesses of the first and second electrode patterns 116b and 118b, widths of the irregular portions C' and a distance between the light emitting structure of the semiconductor light emitting device 120 and the package substrate 110b. In the exemplary embodiment, the height D9 can be determined such that the first and second electrode patterns 116b and 118b do not contact the light emitting structure of the semiconductor light emitting device 120.

Figure 6:
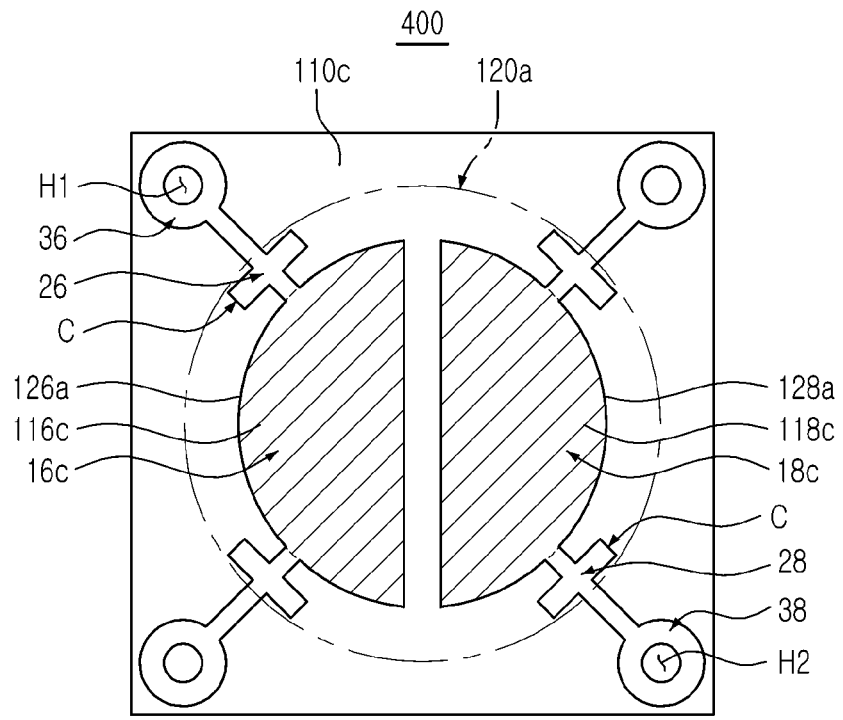
FIGS. 6 through 8 are plan views each schematically illustrating a semiconductor light emitting device package according to an exemplary embodiment of the inventive concept.
Figure 7:
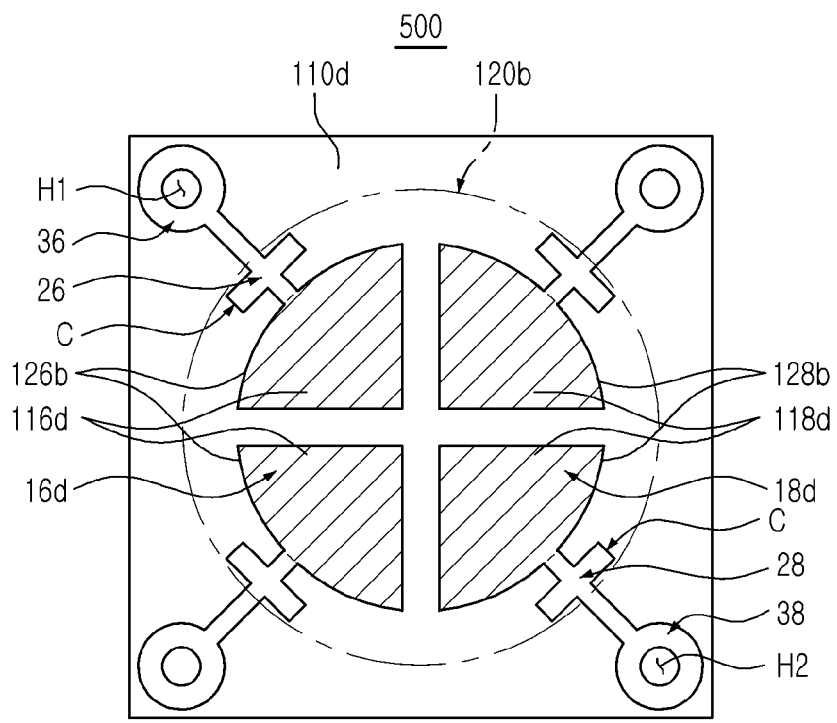
Figure 8:
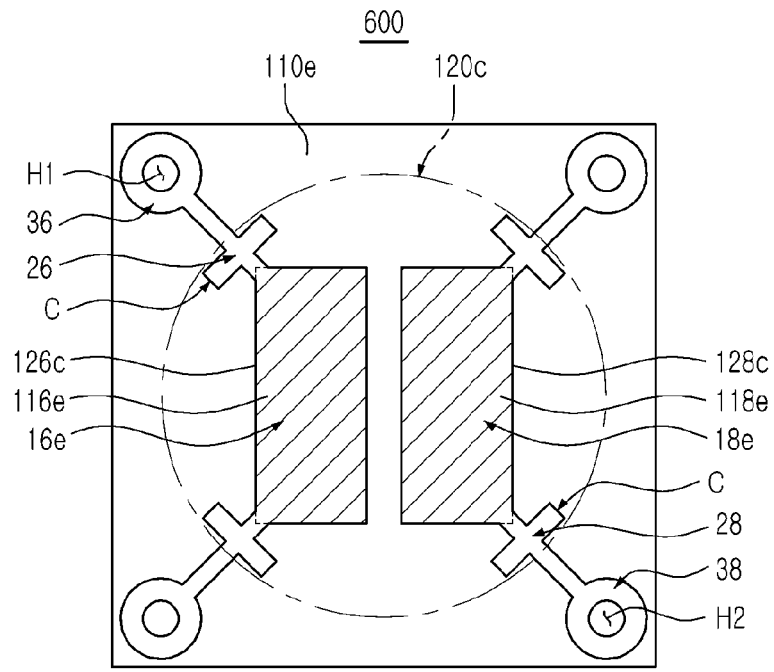

FIGS. 6 through 8 are plan views each schematically illustrating a semiconductor light emitting device package according to an exemplary embodiment of the inventive concept. In FIGS. 6 through 8, a portion of the components of the semiconductor light emitting device package may be omitted, and the omitted components will be understood through the foregoing description with reference to FIGS. 1 and 2.

Referring to FIG. 6, a semiconductor light emitting device package 400 according to an exemplary embodiment of the inventive concept includes a package substrate 110c and a semiconductor light emitting device 120a mounted on the package substrate 110c. The package substrate 110c includes first and second electrode patterns 116c and 118c.

In the exemplary embodiment, the first and second electrode patterns 116c and 118c are connected to first and second electrodes 126a and 128a of the semiconductor light emitting device 120a through device connection portions 16c and 18c, respectively. The device connection portions 16c and 18c may have outer surfaces having shapes similar to that of the semiconductor light emitting device 120a having a circular cross-sectional shape. In the exemplary embodiment, the device connection portions 16c and 18c have semicircular cross-sectional shapes. Although not illustrated in the drawings, an external connection portion having a similar shape to those of the device connection portions 16c and 18c and connected to an external apparatus may also be formed on a surface of the package substrate 110c opposed to a surface thereof on which the semiconductor light emitting device 120a is mounted.

The first and second electrodes 126a and 128a may be disposed on a lower surface of the semiconductor light emitting device 120a. The first and second electrodes 126a and 128a may have the same shapes as the device connection portions 16c and 18c of the first and second electrode patterns 116c and 118c and may be connected to the device connection portions 16c and 18c, respectively.

According to the exemplary embodiment, areas of the first and second electrodes 126a and 128a and the first and second electrode patterns 116c and 118c can be significantly increased, such that heat generated from the semiconductor light emitting device 120a can be efficiently dissipated therethrough.

Referring to FIG. 7, a semiconductor light emitting device package 500 according to another exemplary embodiment of the inventive concept includes a package substrate 110d and a semiconductor light emitting device 120b mounted on the package substrate 110d. The package substrate 110d includes first and second electrode patterns 116d and 118d.

The first and second electrode patterns 116d and 118d are connected to first and second electrodes 126b and 128b of the semiconductor light emitting device 120b through device connection portions 16d and 18d, respectively. The device connection portions 16d and 18d may have outer surfaces having shapes similar to that of the semiconductor light emitting device 120b having a circular cross-sectional shape. In the exemplary embodiment, each of the device connection portions 16d and 18d may have a portion of a circle, for example, a shape corresponding to one-fourth of the circle. As illustrated in FIG. 7, the first and second electrode patterns 116d and 118d of the exemplary embodiment include two device connection portions 16d and 18d, respectively, each of the device connection portions 16d and 18d being connected to one of the via holes H1 and H2. Although not illustrated in the drawings, an external connection portion having a shape similar to those of the device connection portions 16d and 18d and connected to an external apparatus may also be formed on a surface of the package substrate 110d opposed to a surface thereof on which the semiconductor light emitting device 120b is mounted.

The first and second electrodes 126b and 128b may be disposed on a lower surface of the semiconductor light emitting device 120b. A plurality of first electrodes 126b and a plurality of second electrodes 128b may be formed to have the same shapes as the device connection portions 16d and 18d of the first and second electrode patterns 116d and 118d and may be connected to the device connection portions 16d and 18d, respectively. However, the present inventive concept is not limited thereto and the first and second electrodes 126b and 128b may have shapes different from those of the device connection portions 16d and 18d of the first and second electrode patterns 116d and 118d based on different embodiments.

According to the exemplary embodiment, the plurality of first and second electrodes 126b and 128b and the plurality of device connection portions 16d and 18d may be formed to improve reliability of the semiconductor light emitting device package 500.

Referring to FIG. 8, a semiconductor light emitting device package 600 according to an embodiment of the inventive concept may include a package substrate 110e and a semiconductor light emitting device 120c mounted on the package substrate 110e. The package substrate 110e includes first and second electrode patterns 116e and 118e.

The first and second electrode patterns 116e and 118e are connected to first and second electrodes 126c and 128c of the semiconductor light emitting device 120c through device connection portions 16e and 18e, respectively. The device connection portions 16e and 18e may have quadrangular shapes. In the exemplary embodiment, each of the device connection portions 16e and 18e may have a quadrangular shape. Although not illustrated in the drawings, an external connection portion having a shape similar to those of the device connection portions 16e and 18e and connected to an external apparatus may also be formed on a surface of the package substrate 110e opposed to a surface thereof on which the semiconductor light emitting device 120c is mounted.

The first and second electrodes 126c and 128c may be disposed on a lower surface of the semiconductor light emitting device 120c. The first and second electrodes 126c and 128c may be formed to have the same shapes as the device connection portions 16e and 18e of the first and second electrode patterns 116e and 118e and may be connected to the device connection portions 16e and 18e, respectively. However, the present invention is not limited thereto and the first and second electrodes 126c and 128c may have shapes different from those of the device connection portions 16e and 18e of the first and second electrode patterns 116e and 118e according to different embodiments.

Figure 9:
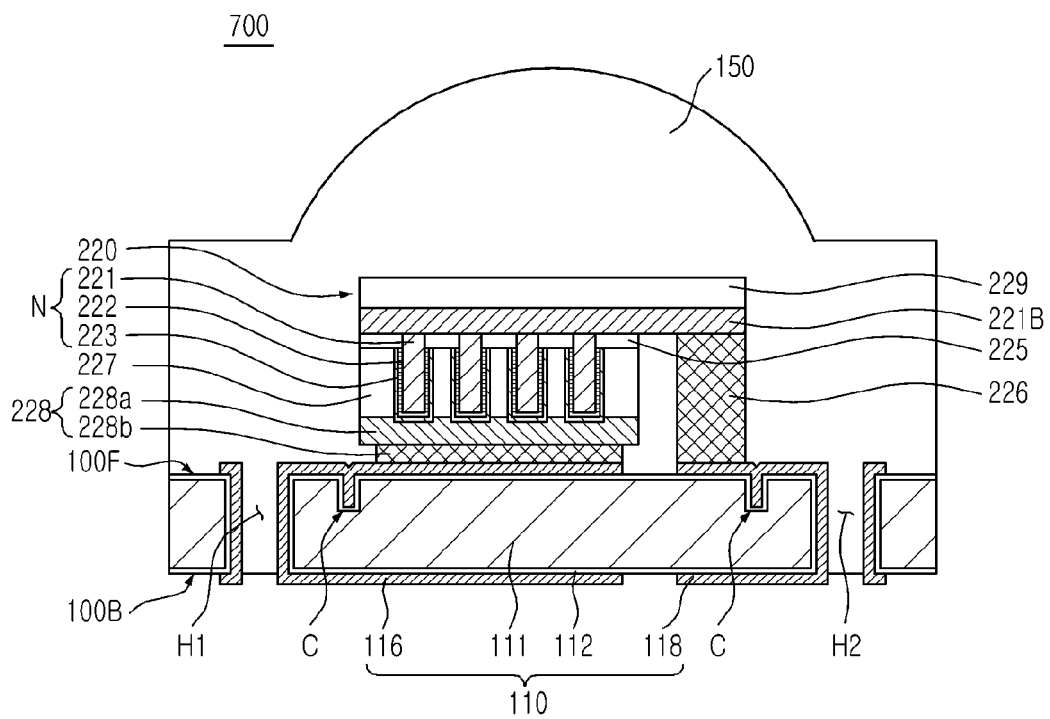
FIG. 9 is a cross-sectional view schematically illustrating a semiconductor light emitting device package according to an exemplary embodiment of the inventive concept.

FIG. 9 is a cross-sectional view schematically illustrating a semiconductor light emitting device package according to an exemplary embodiment of the inventive concept.

Referring to FIG. 9, a semiconductor light emitting device package 700 according to an exemplary embodiment of the inventive concept includes the package substrate 110 and a semiconductor light emitting device 220 mounted on the package substrate 110. The semiconductor light emitting device 220 according to the exemplary embodiment includes a light emitting nanostructure N.

The semiconductor light emitting device 220 further includes a substrate 229, a first conductivity type semiconductor base layer 221B formed on the substrate 229, an insulating layer 225, and first and second electrodes 226 and 228. The light emitting nanostructure N includes a first conductivity type semiconductor core 221, an active layer 222, and a second conductivity type semiconductor layer 223, grown from the first conductivity type semiconductor base layer 221B.

The substrate 229 may be provided as a growth substrate for the light emitting nanostructure N. The substrate 229 can be formed of a material such as sapphire, SiC, Si, $MgAl_2O_4$, MgO, $LiAlO_2$, $LiGaO_2$, GaN or the like and may be formed of an insulating material, a conductive material, or a single crystalline or polycrystalline material. In the exemplary embodiment, sapphire, widely used as a nitride semiconductor growth substrate, is a crystal having Hexa-Rhombo R3c symmetry. The sapphire embodiment, the C plane is mainly used as a nitride growth substrate because the C plane relatively facilitates the growth of a nitride film and is stable at high temperatures. Meanwhile, a silicon (Si) substrate may be suitably used as the substrate 229. Since the Si substrate is appropriate for obtaining a substrate having a large diameter and requires relatively low manufacturing costs, mass production thereof may be enhanced. In the case of using the Si substrate, after a nucleation layer formed of a material such as $Al_xGa_{1-x}N$ is formed on the substrate 229, a nitride semiconductor having a desired structure may be grown on the nucleation layer.

Although not illustrated in the drawings, the semiconductor light emitting device 220 may further include a buffer layer positioned between the substrate 229 and the first conductivity type semiconductor base layer 221B.

The light emitting nanostructure N may include the first conductivity type semiconductor core 221, the active layer 222, and the second conductivity type semiconductor layer 223. As illustrated in FIG. 9, the semiconductor light emitting device 220 includes a plurality of light emitting nanostructures N formed on the substrate 229. Although each light emitting nanostructure N is illustrated having a rod shape as a core-shell structure, it is not limited to thereto and may have other shapes such as a pyramidal shape. According to other exemplary embodiments, the light emitting nanostructures N may include nanowires, quantum dots, or nanobox structures, for example. In addition, each light emitting nanostructure N may have a surface inclined with respect to a surface of the substrate 229, and a cross-section thereof parallel to the substrate 229 may have a polygonal shape such as a triangle, a quadrangle, a pentagon, a hexagon, an octagon or the like, a circular shape, or the like and may be variously shaped.

The first conductivity type semiconductor base layer 221B may provide a growth surface for the light emitting nanostructures N. The insulating layer 225 may provide an open region for growth of the light emitting nanostructures N and may be formed of a dielectric material such as $SiO_2$ or $SiN_x$. The open region may have a dimension of 5 nm to 10 μm. The semiconductor light emitting device 220 may further include a filling member 227 filling spaces between the light emitting nanostructures N. The filling member 227 may structurally stabilize the light emitting nanostructures N and serve to transmit light therethrough or reflect light therefrom. In a case in which the filling member 227 includes a light transmissive material, the filling member 227 may be formed of a transparent material such as $SiO_2$, SiNx, an elastic resin, silicon, an epoxy resin, a polymer, or plastic. In a case in which the filling member 227 includes a reflective material, the filling member 227 may be formed using a material containing $TiO_2$, $Al_2O_3$ or the like, having a high light reflectivity in a polymer material such as polypthalamide (PPA) or the like. In addition, the filling member 227 may be formed of a material having high heat resistance and light fastness stabilities.

The first and second electrodes 226 and 228 may be disposed on a lower surface of the semiconductor light emitting device 220. The first electrode 226 may be disposed on an exposed surface of the first conductivity type semiconductor base layer 221B and the second electrode 228 may include an ohmic contact layer 228a formed under the light emitting nanostructures N and the filling member 227 and an electrode extension portion 228b. According to exemplary embodiments, the ohmic contact layer 228a and the electrode extension portion 228b may be integrally formed. The ohmic contact layer 228a may include a reflective or a light trsnsmissive material. The reflective material may include Ag, Al or alloys thereof and the ohmic contact layer 228a may also have a structure in which multiple layers including Ag, Al and alloys thereof are stacked. Alternatively, the ohmic contact layer 228a may also have a reflective structure using a distributed Bragg reflector (DBR) structure. Although not illustrated in the drawings, in the semiconductor light emitting device 220, the substrate 229 may have unevenness on the surface thereof and a wavelength conversion member including phosphors may be disposed on the substrate 229. According to other embodiments, the substrate 229 may be removed and the first conductivity type semiconductor base layer 221B may have unevenness or a wavelength conversion member formed on the surface thereof.

Figure 10:
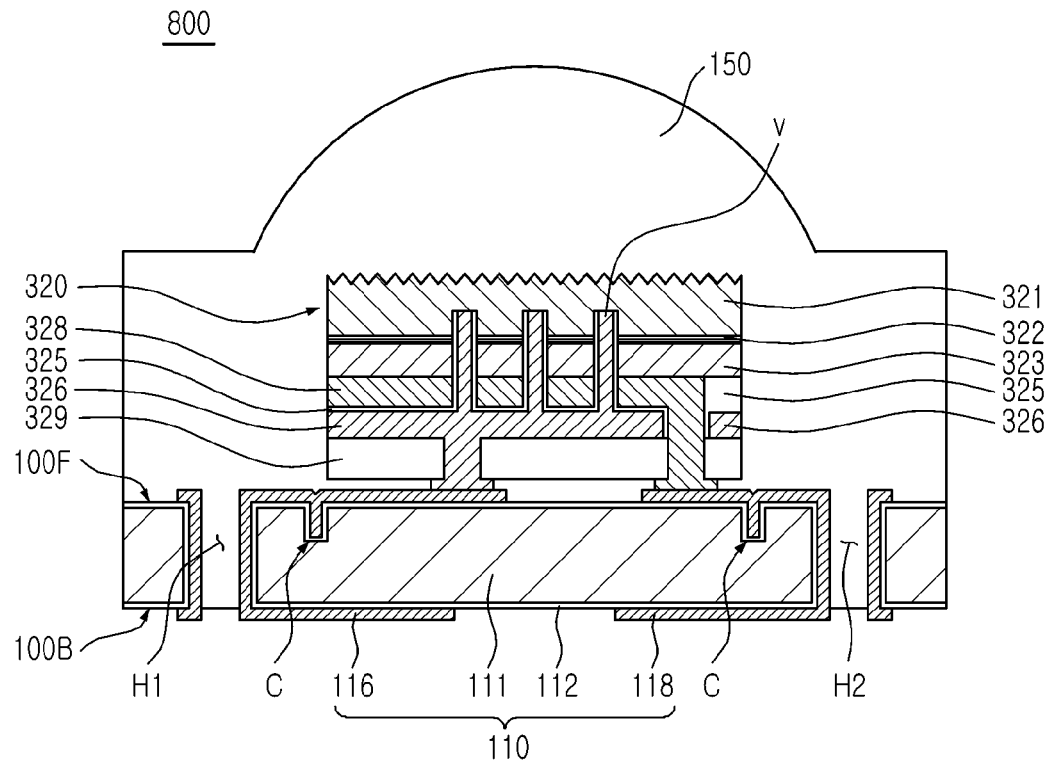
FIG. 10 is a cross-sectional view schematically illustrating a semiconductor light emitting device package according to an exemplary embodiment of the inventive concept.

FIG. 10 is a cross-sectional view schematically illustrating a semiconductor light emitting device package according to another exemplary embodiment of the inventive concept.

Referring to FIG. 10, a semiconductor light emitting device package 800 according to an exemplary embodiment of the inventive concept includes the package substrate 110 and a semiconductor light emitting device 320 mounted on the package substrate 110.

The semiconductor light emitting device 320 according to the embodiment may include a substrate 329, a first conductivity type semiconductor layer 321, an active layer 322, a second conductivity type semiconductor layer 323, and first and second electrodes 326 and 328.

The first electrode 326 may be disposed on the substrate 329 and electrically connected to the first conductivity type semiconductor layer 321 through the via v, and the second electrode 328 may be disposed on the first electrode 326 and connected to the second conductivity type semiconductor layer 323. The first and second electrodes 326 and 328 may respectively extend in a direction of the substrate 329 and be exposed to a lower surface of the substrate 329. In order to implement such a structure, the second electrode 328 may pass through a through hole formed in the first electrode 326.

An electrode insulating layer 325 may be disposed on the circumference of the via v in order to electrically isolate the first electrode 326 from the second conductivity type semiconductor layer 323 and the active layer 322. The electrode insulating layer 325 may be interposed between the first electrode 326 and the second electrode 328 and in this example, electrode insulating layer 325 may be formed of a silicon oxide or silicon nitride having a thickness of approximately 0.7 μm to 1.2 μm.

FIGS. 11A through 11I are views schematically illustrating respective processes in manufacturing semiconductor light emitting device packages according to an exemplary embodiment of the inventive concept. Although FIGS. 11A through 11I are illustrated based on the semiconductor light emitting device package of FIGS. 1 and 2, the semiconductor light emitting device packages of FIGS. 3 to 10 may also be manufactured in a similar manner to that of FIGS. 1 and 2.

Figure 11A:
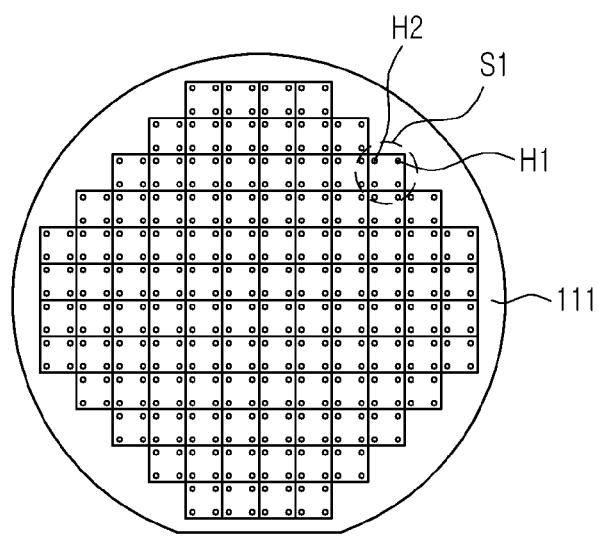
FIGS. 11A through 11I are views schematically illustrating respective main processes in a manufacturing method of the semiconductor light emitting device package according to the exemplary embodiment of the inventive concept.

Referring to FIG. 11A, the body member 111 configuring the package substrate 110 (refer to FIG. 2) may be provided in the form of a wafer. The body member 111 includes a plurality of device regions S1.

Next, the plurality of first and second via holes H1 and H2 penetrating through the body member 111 may be formed in the respective device regions S1. The plurality of first and second via holes H1 and H2 may be arranged to have predetermined patterns in rows and columns in the entire region of the body part 111. The plurality of first and second via holes H1 and H2 are formed through a drilling process, an etching process and the like. The plurality of first and second via holes H1 and H2 may be formed outside of the region for mounting the semiconductor light emitting device package 120 (refer to FIG. 2), in each device region S1.

Figure 11B:
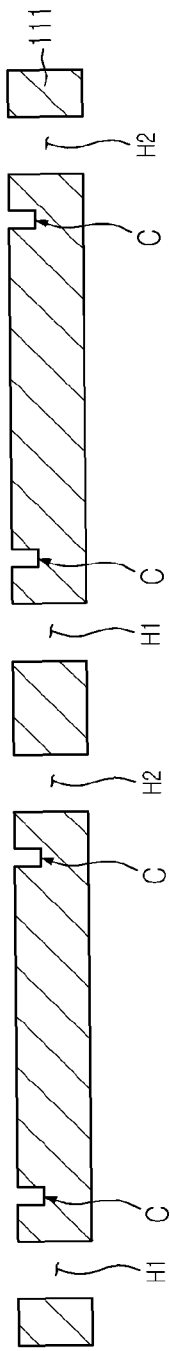

Referring to FIG. 11B, a process for forming a plurality of irregular portions C is performed on an upper surface of the body member 111. The plurality of irregular portions C are disposed adjacent to the plurality of first and second via holes H1 and H2, respectively.

The plurality of irregular portions C may be formed by an etching process using a mask layer (not illustrated). The etching process may include a dry etching or a wet etching process.

Figure 11C:
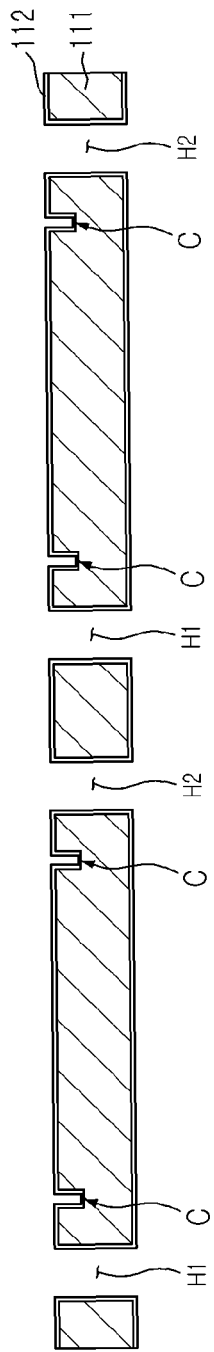

Referring to FIG. 11C, the insulating layer 112 covering surfaces of the plurality of first and second via holes H1 and H2 and the surface of the body member 111 is formed.

In the exemplary embodiment, the insulating layer 112 can be formed by a coating method using a resin having fluidity, and such a coating method can be done by a screen printing process or a spin coating process.

Figure 11D:
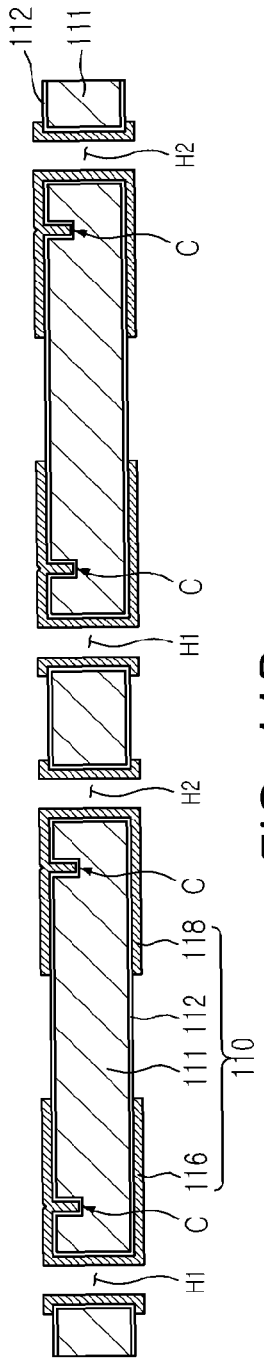

Referring to FIG. 11D, the first and second electrode patterns 116 and 118 are formed on the insulating layer 112.

The first and second electrode patterns 116 and 118 may be formed by forming an electrical conductive material such as copper, silver, or the like so as to have a thin film shape through a plating or deposition process and then performing a patterning process. The first and second electrode patterns 116 and 118 are formed to cover portions of an upper surface and a lower surface of a laminated structure including the body member 111 and the insulating layer 112 and the inside surfaces of the first and second via holes H1 and H2.

The package substrate 110 may be manufactured by forming the first and second electrode patterns 116 and 118, and the first and second electrode patterns 116 and 118 may extend from the upper surface of the package substrate 110 to the lower surface thereof through the first and second via holes H1 and H2.

According to exemplary embodiments, each of the first and second electrode patterns 116 and 118 are fabricated in a thin film form and then adhered to the insulating layer 112. In this case, a separate process for forming a conductive layer on the inside surfaces of the first and second via holes H1 and H2 may be required in order to electrically connect the first and second electrode patterns 116 and 118 which are provided on the upper and lower surfaces of the package substrate 110.

Figure 11E:
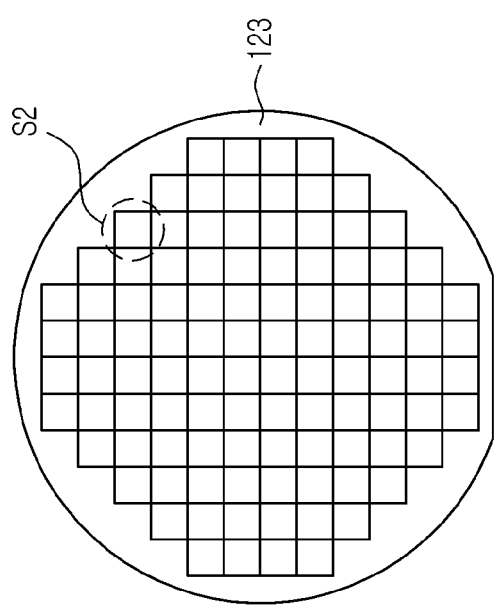
Figure 11F:
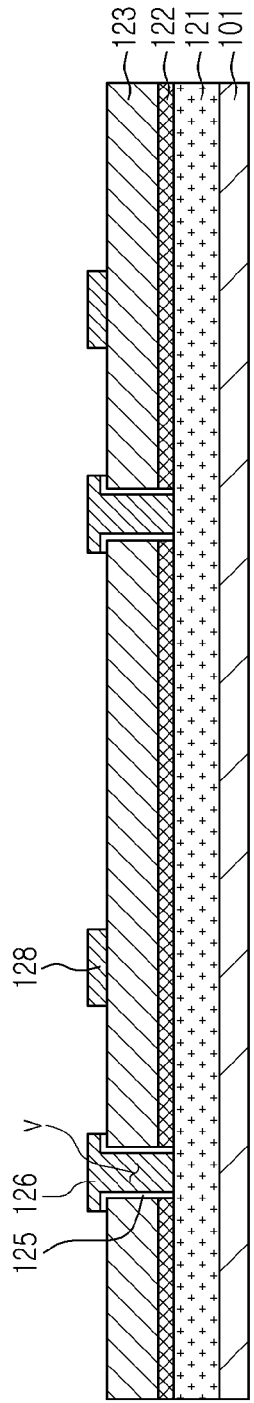

FIGS. 11E and 11F show a process for forming the light emitting structure including the first conductivity type semiconductor layer 121, the active layer 122, and the second conductivity type semiconductor layer 123 on a substrate 101.

The substrate 101 can be on a wafer and a light emitting structure for forming a plurality of semiconductor light emitting devices may be manufactured simultaneously. The substrate 101 includes device regions S2, which will form the plurality of semiconductor light emitting devices. Each device region S2 is a region for mounting a single semiconductor light emitting device and may have a square shape, a rectangular shape, a triangular shape, or any other polygonal shape, a side of which having a width of 300 µm to 10,000 µm.

The substrate 101 can be provided as a semiconductor growth substrate and may be a Si substrate, for example. The first conductivity type semiconductor layer 121, the active layer 122, and the second conductivity type semiconductor layer 123 are sequentially grown on the substrate 101 using a process, such as metal organic chemical vapor deposition (MOCVD), hydride vapor phase epitaxy (HYPE), molecular beam epitaxy (MBE) or the like.

Then, in order to form the via v for the first electrode 126, a via hole is formed by an etching process using a mask and the electrode insulating layer 125 may be disposed thereon. The via v may not be limited to being illustrated in the drawings and a plurality of vias v may be formed in a single device region S2. The amount of the vias v and a contact area thereof with the first conductivity type semiconductor layer 121 may be controlled in such a manner that a cross-sectional area of the plurality of vias v in contact with the first conductivity type semiconductor layer 121 is within a range of 1% to 5% of a cross-sectional area of the semiconductor light emitting device 120 (refer to FIG. 2).

Next, a conductive ohmic material may be disposed on the light emitting structure to form the first and second electrodes 126 and 128. For example, the first and second electrodes 126 and 128 may be formed of various types of material and various laminated structures may be applied to the first and second electrodes 126 and 128 in order to improve ohmic properties and reflective properties thereof.

Figure 11G:
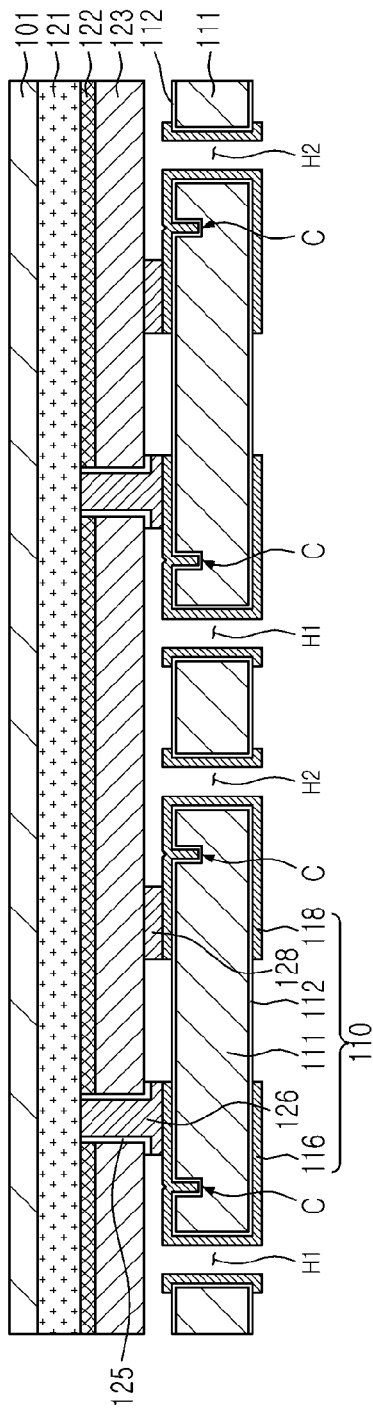

FIG. 11G illustrates a process for bonding the package substrate 110 described with reference to FIG. 11D, and the substrate 101 of FIG. 11F, on which the light emitting structure is formed.

In the exemplary embodiment, the bonding process is performed such that the first and second electrode patterns 116 and 118 of the package substrate 110 are connected to the first and second electrodes 126 and 128 of the substrate 101, respectively. The bonding process may be, for example, an eutectic bonding process. According to other exemplary embodiments, a solder ball or a bonding layer may be disposed between the first and second electrode patterns 116 and 118 and the first and second electrodes 126 and 128.

Figure 11H:
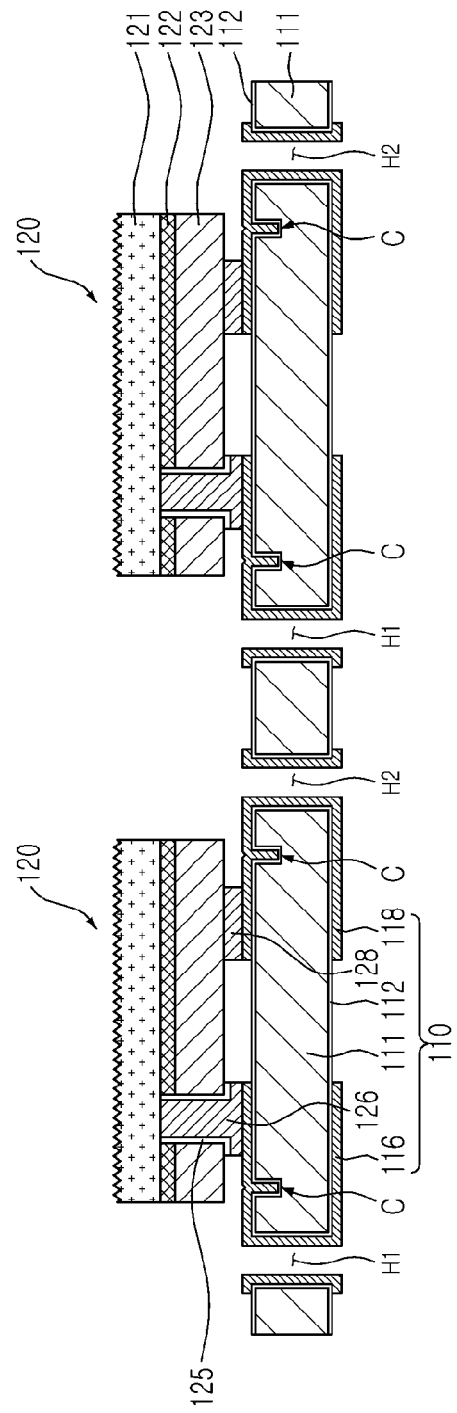

Referring to FIG. 11H, the substrate is first removed. In a case in which the substrate 101 is formed of a transparent material such as sapphire, the substrate 101 may be removed through a laser lift off process in which a laser beam is irradiated. In the case of a silicon substrate, the substrate may be removed through mechanical grinding, polishing, or wet etching or dry-etching. According to other embodiments, the substrate 101 may not be removed.

Next, unevenness may be formed on the upper surface of the first conductivity type semiconductor layer 121 in order to improve light extraction efficiency. When the substrate 101 is not removed, the unevenness may be formed on the upper surface of the substrate 101. The unevenness may be formed by, for example, mechanical cutting, polishing, wet etching or dry etching using plasma. The unevenness may have a micro uneven pattern having a height of 1.0 µm to 3.0 µm or a diameter of 1.0 µm to 3.0 µm, or have a line pattern having a "V"-shaped groove.

Then, the light emitting structure is separated into a plurality of semiconductor light emitting structures 120. Thus, the plurality of semiconductor light emitting structures 120 can be formed. Each of the semiconductor light emitting structures 120 may have a circular cross-sectional shape as illustrated in FIG. 1. Before the separation process, a passivation layer (not illustrated) covering at least a portion of a light emitting laminate may be formed. In addition, the unevenness of the first conductivity type semiconductor layer 121 may be formed after the separation process for the light emitting structure.

According to the exemplary embodiment, since the first and second via holes H1 and H2 may be disposed outside of the semiconductor light emitting device 120 and the semiconductor light emitting device 120 is not positioned on the first and second via holes H1 and H2 having relatively large diameters, damage to the semiconductor light emitting device 120 may be prevented during a subsequent process performed after the substrate 101 has been removed.

Figure 11I:
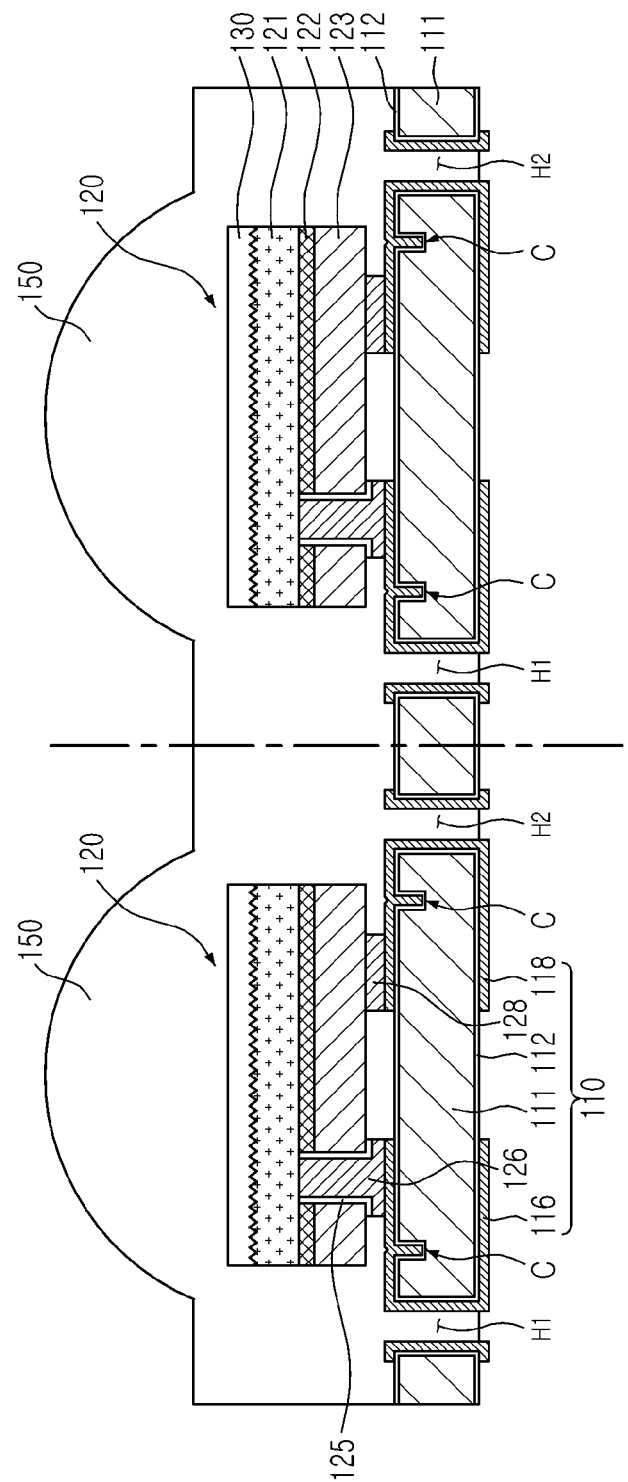

As shown in FIG. 11I, a wavelength conversion member 130 and the lens 150 may be formed on the semiconductor light emitting device 120.

The wavelength conversion member 130 may be formed of a mixture of oxide, silicate, nitride, and sulfide phosphors, or the like. The oxide phosphors may include a yellow and green phosphor such as $(Y, Lu, Se, La, Gd, Sm)_3(Ga, Al)_5O_{12}$:Ce, a blue phosphor such as $BaMgAl_{10}O_{17}$:Eu, $3Sr_3(PO_4)_2$.CaCl: Eu, and the like. The silicate phosphors may include a yellow and green phosphor such as $(Ba, Sr)_2SiO_4$:Eu, a yellow and orange phosphor such as $(Ba, Sr)_3SiO_5$:Eu, and the like. The nitride phosphors may include a green phosphor such as β-SiAlON:Eu, a yellow phosphor such as $(La, Gd, Lu, Y, Sc)_3Si_6N_{11}$:Ce, an orange phosphor such as α-SiAlON:Eu, red phosphors such as $(Sr, Ca)AlSiN_3$:Eu, $(Sr, Ca)AlSi(ON)_3$:Eu, $(Sr, Ca)_2Si_5N_8$:Eu, $(Sr, Ca)_2Si_5(ON)_8$:Eu, and $(Sr, Ba)SiAl_4N_7$:Eu, and the like. The sulfide phosphors may include red phosphors such as $(Sr, Ca)S$:Eu and $(Y, Gd)_2O_2S$: Eu, a green phosphor such as $SrGa_2S_4$:Eu and the like.

The lens 150 may be formed on the wavelength conversion member 130 by a spray coating method, for example. The lens 150 may be provided in such a manner that the lens 150 is formed on the semiconductor light emitting device 120 and the wavelength conversion member 130 so as to have a certain shape and then is hardened. The lens 150 may be formed to fill the interiors of the first and second via holes H1 and H2.

Then, a process for separating the structure of FIG. 11I into respective semiconductor light emitting device package units is performed along a dash dot line to finally obtain individual semiconductor light emitting device packages 100 of FIGS. 1 and 2. The separation process can be performed by blade sawing or laser sawing. By doing so, a mass production of the semiconductor light emitting device packages 100 can be performed. In particular, in the chip scale package (CSP) according to the exemplary embodiment, since a molding structure having a reflective cup shape may be omitted and the overall package size corresponds to a chip size, the chip scale package (CSP) is advantageous for miniaturization of a product. In addition, since the lens 150 having a circular cross-sectional shape may be formed on the semiconductor light emitting device having a circular cross-sectional shape, a package size may be further miniaturized.

Figure 12:
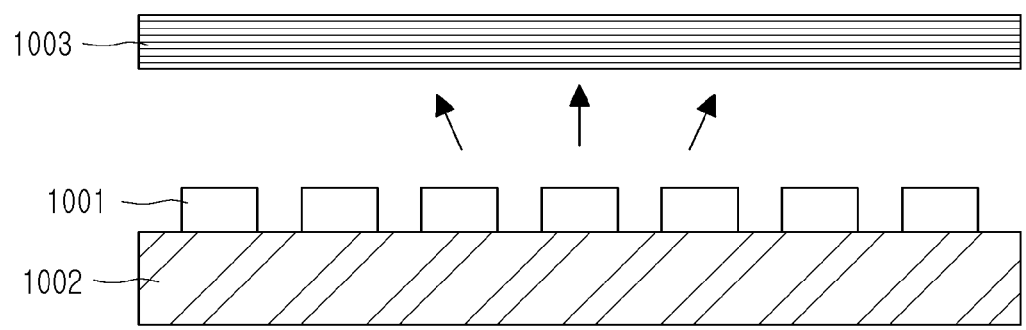
FIGS. 12 and 13 are views respectively illustrating an example of applying the semiconductor light emitting device package according to the exemplary embodiment of the inventive concept to a backlight unit.
Figure 13:
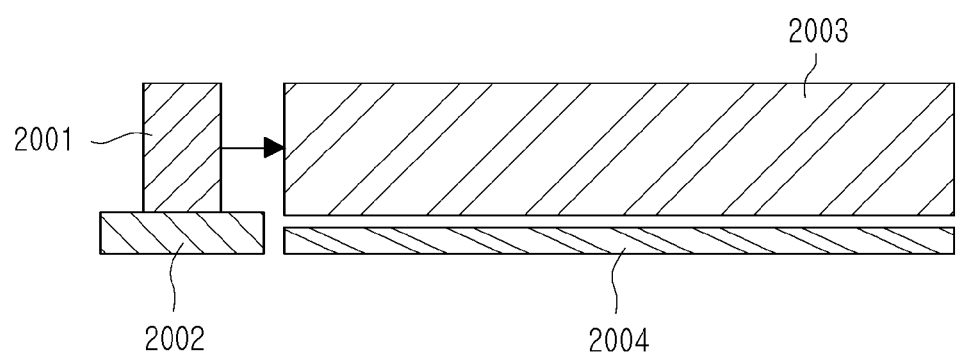

FIGS. 12 and 13 are views respectively illustrating an example of applying the semiconductor light emitting device package according to an exemplary embodiment of the inventive concept to a backlight unit.

Referring to FIG. 12, a backlight unit 1000 includes a light source 1001 mounted on a substrate 1002 and at least one optical sheet 1003 disposed thereabove. The light source 1001 may be a semiconductor light emitting device package having the structure above-described with reference to FIGS. 1 to 10 or a structure similar thereto.

The light source 1001 in the backlight unit 1000 of FIG. 12 emits light toward a liquid crystal display (LCD) device disposed thereabove. On the other hand, as shown in FIG. 13, a light source 2001 mounted on a substrate 2002 in a backlight unit 2000 emits light laterally and the emitted light is incident to a light guide plate 2003 such that the backlight unit 2000 may serve as a surface light source. The light having passed through the light guide plate 2003 may be emitted upwardly and a reflective layer 2004 may be formed under a bottom surface of the light guide plate 2003 in order to improve light extraction efficiency.

Figure 14:
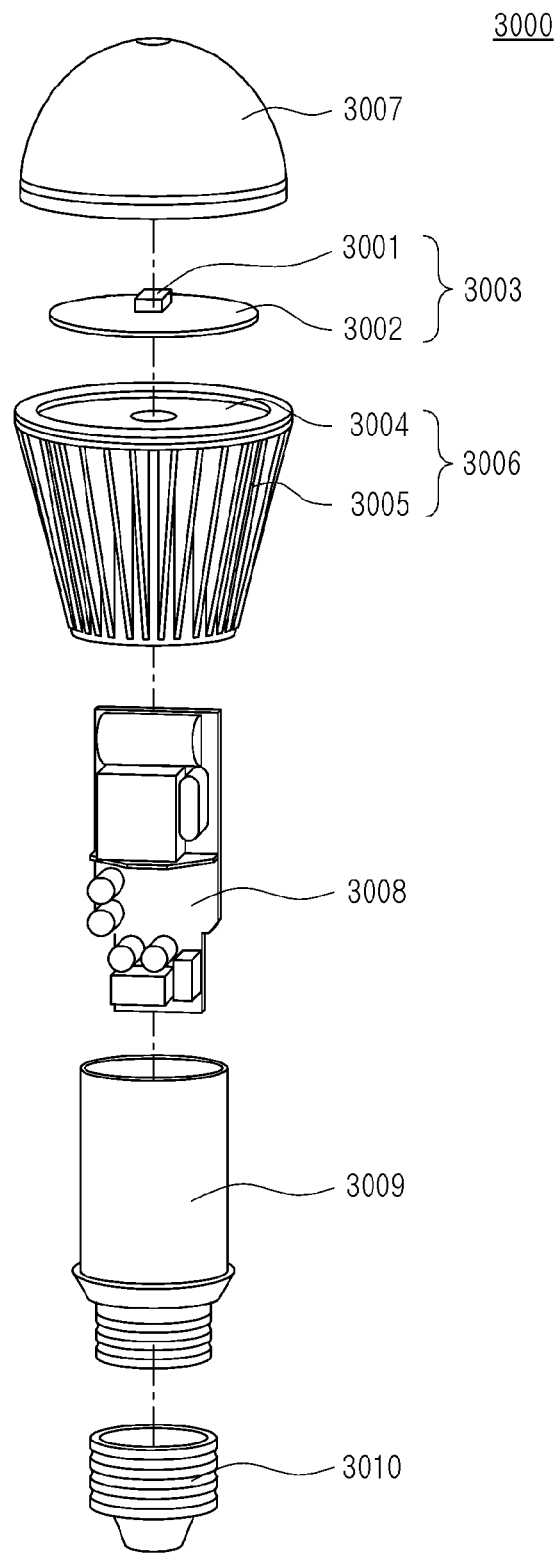
FIG. 14 is a view illustrating an example of applying the semiconductor light emitting device package according to the exemplary embodiment of the inventive concept to a lighting device.

FIG. 14 is a view illustrating an exemplary application of a semiconductor light emitting device package according to the exemplary embodiment of the inventive concept to a lighting device.

Referring to an exploded perspective view of FIG. 14, a lighting device 3000 is exemplified as a bulb-type lamp, and includes a light emitting module 3003, a driving unit 3008 and an external connector unit 3010. In addition, exterior structures such as an external housing 3006, an internal housing 3009, a cover unit 3007 and the like may be additionally included. The light emitting module 3003 may include a light source 3001 having the semiconductor light emitting device package structure above-described with reference to FIGS. 1 to 10 or a structure similar thereto, and a circuit board 3002 having the light source 3001 mounted thereon. The exemplary embodiment illustrates the case in which a single light source 3001 is mounted on the circuit board 3002; however, if necessary, a plurality of light sources may be mounted thereon.

The external housing 3006 may serve as a heat radiating part, and include a heat sink plate 3004 in direct contact with the light emitting module 3003 to improve the dissipation of heat and heat radiating fins 3005 surrounding a side surface of the lighting device 3000. In addition, the cover unit 3007 is disposed above the light emitting module 3003 and has a convex lens shape. The driving unit 3008 is disposed inside the internal housing 3009 and connected to the external connector unit 3010 such as a socket structure to receive power from an external power source. In addition, the driving unit 3008 converts the received power into a current source appropriate for driving the light source 3001 of the light emitting module 3003 and supply the converted current source thereto. For example, the driving unit 3008 may be provided as an AC-DC converter, a rectifying circuit part, or the like.

Although not illustrated in drawings, the light device 3000 may further include a communications module.

Figure 15:
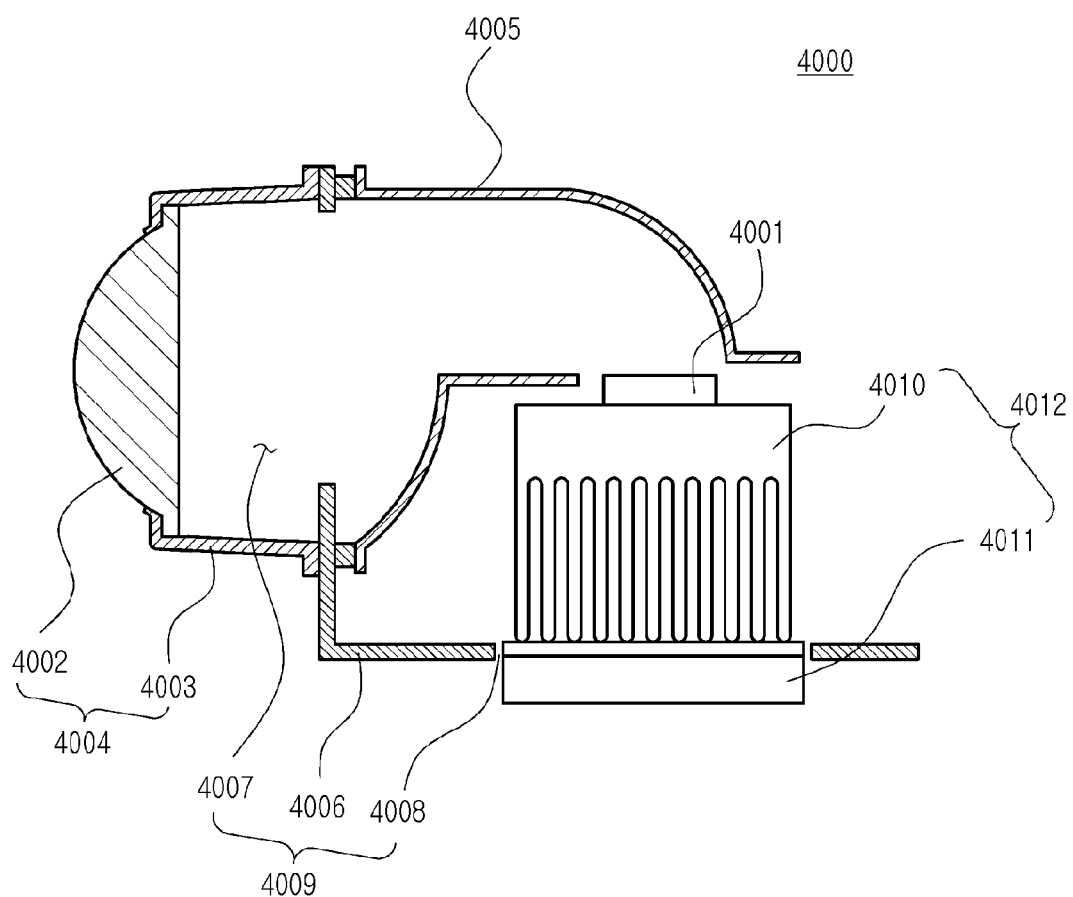
FIG. 15 is a view illustrating an example of applying the semiconductor light emitting device package according to the exemplary embodiment of the inventive concept to a headlamp.

FIG. 15 is a view illustrating an exemplary application of the semiconductor light emitting device package according to the exemplary embodiment of the inventive concept to a headlamp.

Referring to FIG. 15, a headlamp 4000 used as a vehicle lighting element or the like includes a light source 4001, a reflective unit 4005 and a lens cover unit 4004. The lens cover unit 4004 includes a hollow guide part 4003 and a lens 4002. The light source 4001 includes at least one of the semiconductor light emitting device packages of FIGS. 1 to 10.

In addition, the head lamp 4000 further includes a heat radiating unit 4012 dissipating heat generated by the light source 4001 outwardly. The heat radiating unit 4012 includes a heat sink 4010 and a cooling fan 4011 in order to effectively dissipate heat. Further, the headlamp 4000 includes a housing 4009 allowing the heat radiating unit 4012 and the reflective unit 4005 to be fixed thereto and supported thereby. One surface of the housing 4009 is provided with a housing body 4006 and a central hole 4008 into which the heat radiating unit 4012 is inserted to be coupled thereto.

The other surface of the housing 4009 integrally connected to one surface of the housing 4009 and bent in a direction perpendicular to one surface of the housing 4009 is provided with a forward hole 4007 such that the reflective unit 4005 can be disposed above the light source 4001. Accordingly, a forward side can be opened by the reflective unit 4005 and the reflective unit 4005 is fixed to the housing 4009 such that the opened forward side corresponds to the forward hole 4007, whereby light reflected by the reflective unit 4005 disposed above the light source 4001 can pass through the forward hole 4007 to be emitted outwardly.

As set forth above, according to various exemplary embodiments of the inventive concept, an electronic device package having a subminiature size can be obtained, while ensuring reliability, and a package substrate for the same can be provided.

While the present inventive concept has been illustrated and described in connection with the exemplary embodiments described herein, it will be apparent to those skilled in the art that modifications and variations can be made without departing from the spirit and scope of the inventive concept as defined by the appended claims.

What is claimed is:

1. An electronic device package comprising:
an electronic device including a first electrode and a second electrode disposed on a surface thereof; and
a package substrate having a first surface including the electronic device mounted thereon and a second surface opposed to the first surface,
wherein the package substrate includes:
a first electrode pattern and a second electrode pattern electrically connected to the first electrode and the second electrode on the first surface, respectively;
at least one via hole disposed outside of a region on which the electronic device is mounted, in the package substrate; and
an irregular portion disposed on the first surface between the via hole and the first electrode,
wherein the first electrode pattern extends from the first electrode to the via hole, and the first electrode pattern extends through the irregular portion between the via hole and the first electrode.

2. The electronic device package of claim 1, wherein the irregular portion includes a recessed portion, and at least one portion of the recessed portion is filled with the first electrode pattern or the second electrode pattern.

3. The electronic device package of claim 1, wherein the irregular portion includes a protrusion portion, and the protrusion portion is covered by the first electrode pattern or the second electrode pattern.

4. The electronic device package of claim 1, wherein the irregular portion is disposed in a second direction perpendicular to a first direction in which one of the first electrode and the second electrode, adjacent to the irregular portion, and the via hole are connected.

5. The electronic device package of claim 4, wherein a length of the irregular portion in the second direction is greater than a length thereof in the first direction.

6. The electronic device package of claim 1, wherein the irregular portion includes a plurality of irregular portions arranged to be adjacent to each other in parallel.

7. The electronic device package of claim 1, wherein the first electrode pattern and second electrode pattern extend to the second surface.

8. The electronic device package of claim 7, wherein at least one of the first electrode pattern and the second electrode pattern extends to the second surface through an inside wall of the via hole.

9. The electronic device package of claim 1, wherein each of the first electrode pattern and the second electrode pattern includes:
- a device connection portion connected to one of the first electrode and the second electrode;
- an external connection portion disposed on the second surface;
- a connection portion disposed within the via hole and connecting the device connection portion and the external connection portion; and
- a notch portion disposed in the irregular portion.

10. The electronic device package of claim 9, wherein the electronic device has a circular cross-sectional shape and the device connection portion has at least one curved surface corresponding to a portion of the circular cross-sectional shape.

11. The electronic device package of claim 10, wherein the package substrate includes a quadrangular shape, and the via hole is positioned outside of the electronic device, in each corner of the package substrate.

12. The electronic device package of claim 1, wherein:
- the electronic device includes a light emitting structure including a first conductivity type semiconductor layer, an active layer and a second conductivity type semiconductor layer and,
- the first electrode and the second electrode are connected to the first conductivity type semiconductor layer and the second conductivity type semiconductor layer, respectively.

13. The electronic device package of claim 1, further comprising a sealing part, wherein a material forming the sealing part extends into the via hole such that the via hole is filled with the sealing part.

14. A lighting device comprising:
- a light emitting module comprising at least one electronic device package of claim 1;
- a driving unit configured to convert power from an external connector into a current source for driving the light emitting module;
- a cover unit disposed above light emitting module; and
- an external housing enclosing the light emitting module and driving unit.

15. A package substrate having a first surface configured for an electronic device being mounted thereon and a second surface opposed to the first surface, the package substrate comprising:
- an electrode pattern disposed on the first surface;
- a via hole disposed outside of a region on which the electronic device is mounted, in the package substrate; and
- an irregular portion disposed on the first surface between the via hole and a contact region in which the electronic device is in contact with the package substrate,
- wherein the electrode pattern extends from the contact region to the via hole, and the electrode pattern extends through the irregular portion between the via hole and the contact region.

16. A light emitting device package comprising:
- a light emitting device including at least one electrode; and
- a package substrate having a first surface and a second surface opposed to the first surface, wherein:
  - the light emitting device is disposed on the first surface of the package substrate; and
  - the package substrate comprises:
    - a via hole disposed outside of a region for mounting the light emitting device in the package substrate;
    - an irregular portion of the first surface of the package substrate disposed between the at least one electrode and the via hole, wherein the irregular portion of the first surface includes at least one of a recessed portion or a protrusion portion; and
    - an electrode pattern electrically connected to the at least one electrode and extending along the first surface from the at least one electrode to the via hole, wherein the electrode pattern extends through the irregular portion between the via hole and the at least one electrode and fills or covers the irregular portion.

17. The light emitting device package of claim 16, wherein the irregular portion of the first surface of the package substrate includes a recessed portion, and at least one portion of the recessed portion is filled with the at least one electrode pattern.

18. The light emitting device package of claim 16, wherein the irregular portion of the first surface of the package substrate includes a protrusion portion, and the protrusion portion is covered by the at least one electrode pattern.

* * * * *